US012538508B2

(12) United States Patent
Nishi et al.

(10) Patent No.: US 12,538,508 B2
(45) Date of Patent: Jan. 27, 2026

(54) SEMICONDUCTOR DEVICE

(71) Applicant: Mitsubishi Electric Corporation, Tokyo (JP)

(72) Inventors: Koichi Nishi, Tokyo (JP); Kosuke Sakaguchi, Tokyo (JP); Kazuya Konishi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 354 days.

(21) Appl. No.: 18/353,758

(22) Filed: Jul. 17, 2023

(65) Prior Publication Data

US 2024/0178305 A1 May 30, 2024

(30) Foreign Application Priority Data

Nov. 24, 2022 (JP) ................. 2022-187126

(51) Int. Cl.
*H10D 12/00* (2025.01)
*H10D 8/00* (2025.01)
(Continued)

(52) U.S. Cl.
CPC ............ *H10D 12/481* (2025.01); *H10D 8/00* (2025.01); *H10D 62/127* (2025.01); *H10D 64/513* (2025.01)

(58) Field of Classification Search
CPC ...... H10D 12/481; H10D 8/00; H10D 64/513; H10D 62/127
(Continued)

(56) References Cited

U.S. PATENT DOCUMENTS 10,720,524 B1\* 7/2020 Qiao .................... H10D 30/665
2020/0144403 A1    5/2020 Nishi
(Continued)

FOREIGN PATENT DOCUMENTS

JP    2017-147431 A    8/2017
JP    2020-077727 A    5/2020
(Continued)

OTHER PUBLICATIONS

"Notice of Reasons for Refusal" Office Action issued in JP 2022-187126; mailed by the Japanese Patent Office on Oct. 14, 2025.

*Primary Examiner* — Igwe U Anya
(74) *Attorney, Agent, or Firm* — Studebaker Brackett PLLC

(57) ABSTRACT

A semiconductor device according to the present disclosure includes: a semiconductor substrate including at least: an n-type first semiconductor layer; an n-type second semiconductor layer on the first semiconductor layer; a p-type third semiconductor layer on the second semiconductor layer; and an n-type fourth semiconductor layer on an upper layer part of the third semiconductor layer; a plurality of first trench gates passing through the fourth to second semiconductor layers to reach an inner side of the first semiconductor layer; and a first main electrode having contact with the fourth semiconductor layer; wherein the plurality of first trench gates are disconnected in an electrode extraction region provided in a center part of the active region where main current flows, and are connected to the first main electrode in a first electrode extraction part connected to the first gate electrode in the disconnected part.

14 Claims, 26 Drawing Sheets

(51) Int. Cl.
*H10D 62/10* (2025.01)
*H10D 64/27* (2025.01)

(58) Field of Classification Search
USPC .......................................................... 257/139
See application file for complete search history.

(56) References Cited

U.S. PATENT DOCUMENTS

| | | | |
|---|---|---|---|
| 2021/0134990 A1* | 5/2021 | Nishi | H10D 8/422 |
| 2022/0254908 A1 | 8/2022 | Harada | |
| 2023/0072478 A1* | 3/2023 | Ikura | H10D 84/617 |

FOREIGN PATENT DOCUMENTS

| | | | |
|---|---|---|---|
| JP | 2021-072418 A | 5/2021 | |
| JP | 2022-120620 A | 8/2022 | |

* cited by examiner

SEMICONDUCTOR DEVICE

BACKGROUND OF THE INVENTION

Field of the Invention

The present disclosure relates to a semiconductor device, and particularly to a semiconductor device having a split gate structure.

Description of the Background Art

Japanese Patent Application Laid-Open No. 2017-147431 discloses, in FIG. 2, an insulated gate bipolar transistor (IGBT) having a split gate structure. In Japanese Patent Application Laid-Open No. 2017-147431, a gate slip part and an emitter electrode are connected via a contact hole provided to a U-like gate trench part around a chip end portion as illustrated in FIG. 1, thus an invalid region increases. A contact hole connecting the gate split part and the emitter electrode is provided to only one of two active trenches constituting the U-like gate trench part.

SUMMARY

In Japanese Patent Application Laid-Open No. 2017-147431, a contact hole connecting the gate split part and the emitter electrode is provided to only one of two active trenches constituting the U-like gate trench part. Thus, when a defect occurs in forming the contact hole, there is a problem that the gate split part as an embedded electrode serves as a floating potential in two active trenches, and a withstand voltage defect occurs.

An object of the present disclosure is to provide a semiconductor device capable of stably connecting an embedded electrode to an emitter potential.

A semiconductor device according to the present disclosure includes: a semiconductor substrate including at least: a first semiconductor layer of a first conductivity type; a second semiconductor layer of a first conductivity type on the first semiconductor layer; a third semiconductor layer of a second conductivity type on the second semiconductor layer; and a fourth semiconductor layer of a first conductivity type provided on an upper layer part of the third semiconductor layer; a plurality of first trench gates passing through the fourth semiconductor layer, the third semiconductor layer, and the second semiconductor layer in a thickness direction to reach an inner side of the first semiconductor layer; an interlayer insulating film covering each of the plurality of first trench gates; a first main electrode having contact with the fourth semiconductor layer; and a second main electrode provided on a side opposite to the first main electrode in a thickness direction of the semiconductor substrate, wherein each of the plurality of first trench gates has a two-stage structure of a first gate electrode provided on a lower side as a side of the second main electrode and a second gate electrode provided on an upper side as a side of the first main electrode, an inner surface of each of the plurality of first trench gates and an upper surface of the first gate electrode are covered by a first gate insulating film, the plurality of first trench gates are disposed at intervals so that a longitudinal direction of the plurality of first trench gates is parallel to an active region in which main current flows, the second gate electrode includes a first electrode extraction part connected to a wiring region provided along an outer periphery of the active region on both ends of the plurality of first trench gates in the longitudinal direction, discon-nected in an electrode extraction region provided in a center part of the active region, and connected to the first gate electrode in a disconnected part, the first gate electrode is electrically connected to the first main electrode via a first contact passing through the interlayer insulating film in the first electrode extraction part, the electrode extraction region includes a gate intersection trench gate provided to connect first trench gates facing each other in the plurality of first trench gates so as to be perpendicular to the first trench gates facing each other in a plan view, and the gate intersection trench gate has a same cross-sectional structure as the plurality of first trench gates.

According to the semiconductor device of the present disclosure, all of the first gate electrodes are connected by the gate intersection trench gate, thus when even one electrode extraction part is formed, all of the first gate electrodes can be stably connected to the potential of the first main electrode, and a withstand voltage defect can be reduced.

These and other objects, features, aspects and advantages of the present invention will become more apparent from the following detailed description of the present invention when taken in conjunction with the accompanying drawings.

DESCRIPTION OF THE PREFERRED EMBODIMENTS

Introduction

Figure 1:
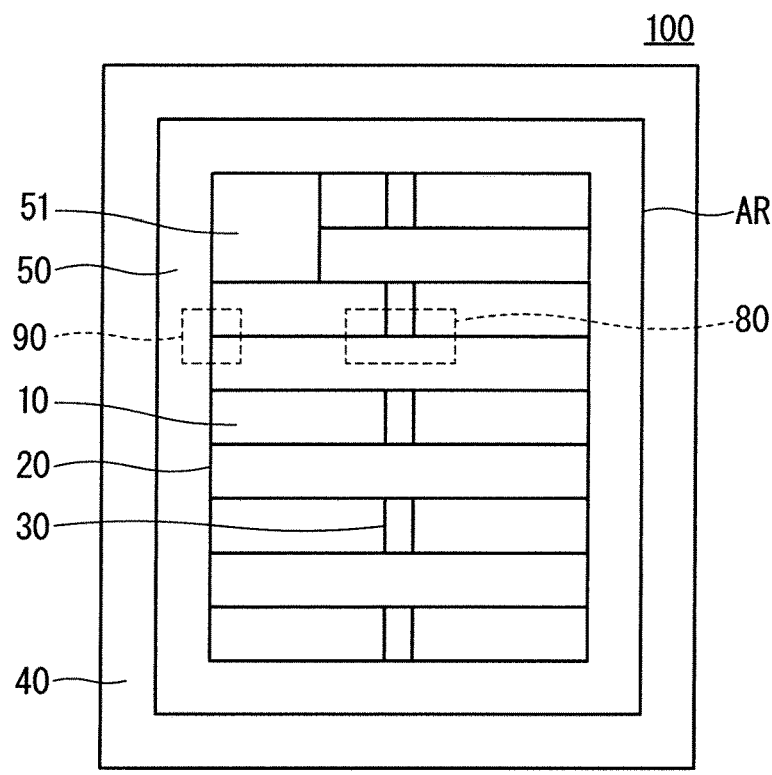
FIG. 1 is a plan view schematically illustrating an example of an upper surface configuration of a whole reverse conducting IGBT according to an embodiment 1 of the present disclosure.

In the description hereinafter, an n type and a p type indicate a conductivity type of a semiconductor, and a first conductivity type is an n type and a second conductivity type is a p type in the present disclosure, however, the first conductivity type may be a p type, and the second conductivity type may be an n type. An $n^-$ type indicates that an impurity concentration thereof is lower than that of the n type, and an $n^+$ type indicates that an impurity concentration thereof is higher than that of the n type. In the similar manner, a $p^-$ type indicates that an impurity concentration thereof is lower than that of the p type, and a $p^+$ type indicates that an impurity concentration thereof is higher than that of the p type.

Used in some cases are terms each indicating a specific position and direction such as "up", "down", "side", "front", and "back", for example, however, these terms are used for convenience of easy understanding of contents of the embodiments, and do not relate to a direction in an actual use.

Since the drawings are schematically illustrated, a mutual relationship of sizes and positions of images respectively illustrated in the different drawings is not necessarily illustrated accurately, but may be appropriately changed. In the description hereinafter, the same reference numerals will be assigned to the similar constituent elements in the drawings, and the constituent elements having the same reference numeral have the similar name and function. Accordingly, the detailed description on them may be omitted in some cases.

Embodiment 1

FIG. 1 is a plan view schematically illustrating an upper surface configuration of a whole reverse conducting IGBT (RC-IGBT) of an embodiment 1 according to the present disclosure, and is a plan view of a semiconductor chip. The RC-IGBT includes an IGBT and a reflux diode provided on the same semiconductor substrate.

The RC-IGBT 100 illustrated in FIG. 1 has a quadrangular outer shape, and its major part is an active region AR including an IGBT region 10 (transistor region) and a diode region 20. The IGBT region 10 and the diode region 20 extend from one end side to the other end side of the RC-IGBT 100, and are alternately provided in a stripe form in a direction perpendicular to an extension direction of the IGBT region 10 and the diode region 20. FIG. 1 illustrates a configuration that five IGBT regions 10 and four diode regions are located, and all of the diode regions 20 are sandwiched by the IGBT region 10, however, the number of the IGBT regions 10 and diode regions 20 is not limited thereto.

A plurality of trench gates extending in parallel to the extension direction of the IGBT region 10 are provided to the IGBT region 10, and both ends of the plurality of trench gates in a longitudinal direction are connected to a wiring region 50 surrounding the active region AR, the wiring region 50 is connected to a gate pad 51 in the active region, and an outer side of the wiring region 50 is surrounded by a terminal region 40. An embedded electrode extraction region 30 is provided in a center of each IGBT region 10.

The active region AR is covered by an emitter electrode via an interlayer insulating film except for an upper side of a gate pad 51, however, the emitter electrode is omitted for descriptive purposes.

Figure 2:
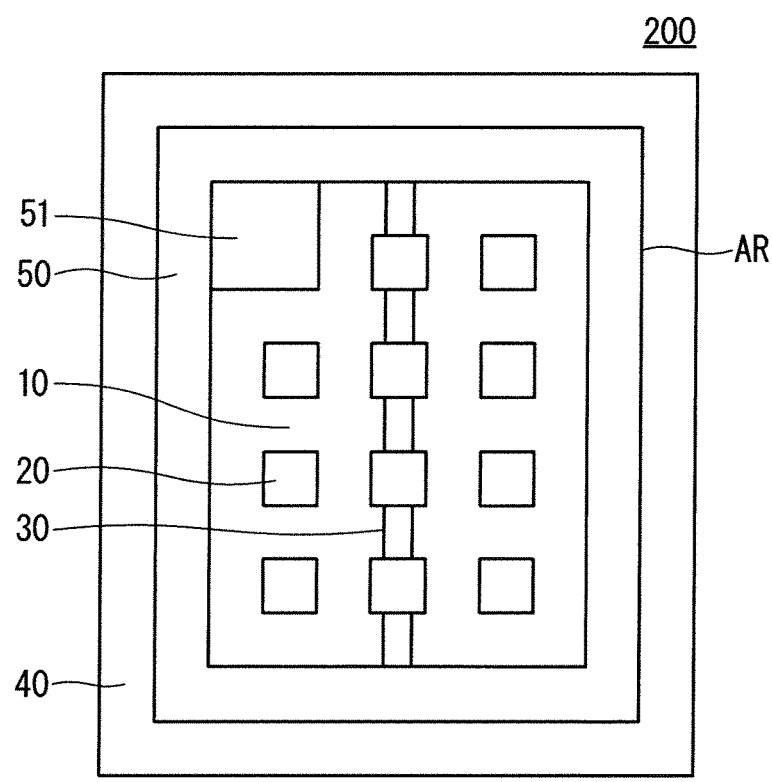
FIG. 2 is a plan view schematically illustrating another example of the upper surface configuration of the whole reverse conducting IGBT according to the embodiment 1 of the present disclosure.

An upper surface configuration such as an RC-IGBT 200 illustrated in FIG. 2 can also be adopted in place of the RC-IGBT 100 illustrated in FIG. 1. In the RC-IGBT 200, the plurality of diode regions 20 are disposed side by side in a vertical direction and a lateral direction in the active region AR, and are surrounded by the IGBT region 10. That is to say, the plurality of diode regions 20 are provided to form an island-like shape in the IGBT region 10.

FIG. 2 illustrates a configuration that the diode regions 20 are provided in a matrix form three rows in a right-left direction in a paper sheet and four rows in an up-down direction in a paper sheet, however, the number and arrangement of the diode regions 20 are not limited thereto. The embedded electrode extraction region 30 is provided between the arranged diode regions 20 in a center of the active region AR.

The embodiment described hereinafter is based on a premise of the RC-IGBT 100 illustrated in FIG. 1, however, the present disclosure can also be applied to the RC-IGBT 200 illustrated in FIG. 2.

Figure 3:
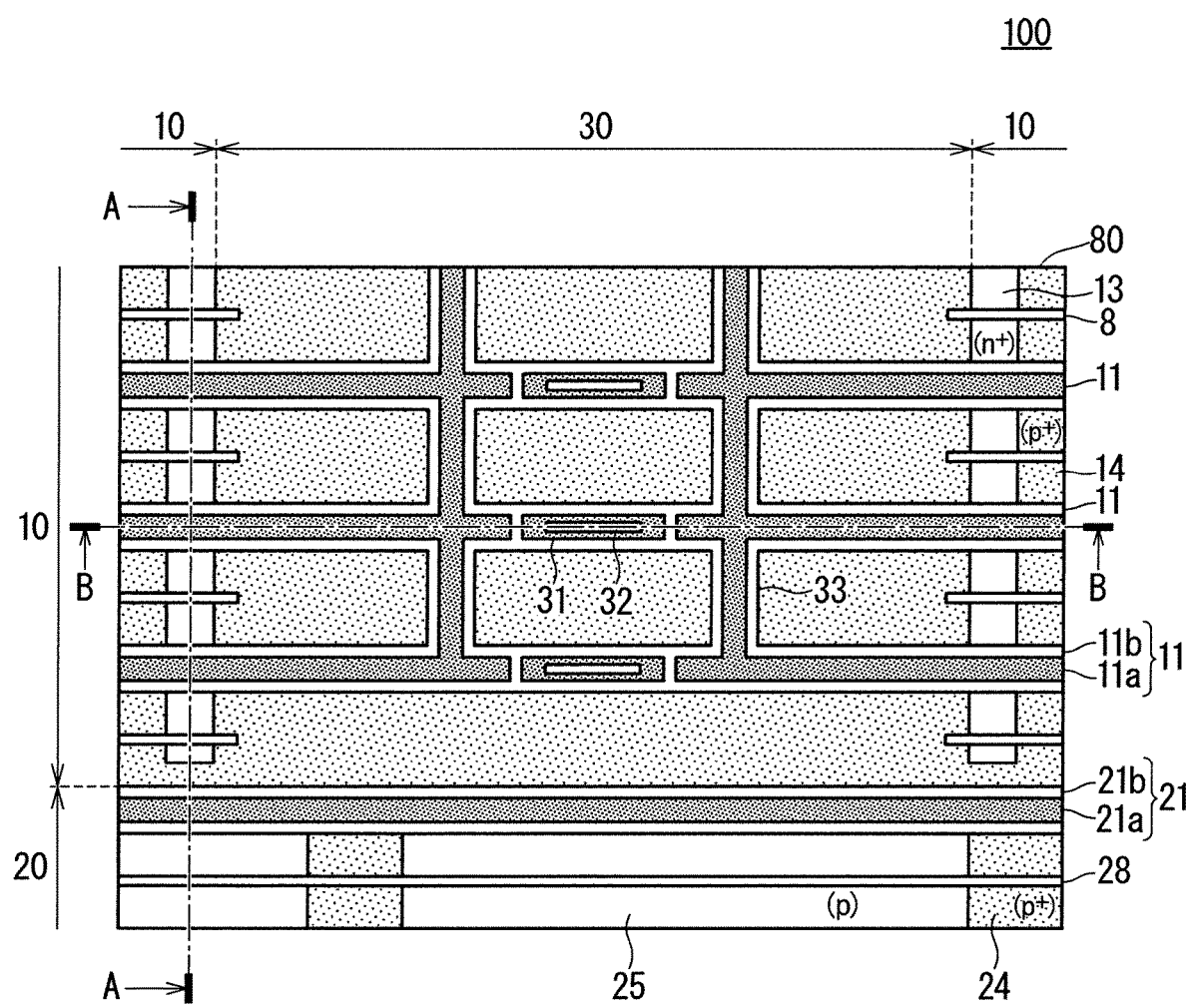
FIG. 3 is a partial plan view of the reverse conducting IGBT according to the embodiment 1 of the present disclosure.

FIG. 3 is a plan view of enlarging a region 80 enclosed by a broken line in the RC-IGBT 100 illustrated in FIG. 1, FIG.

Figure 5:
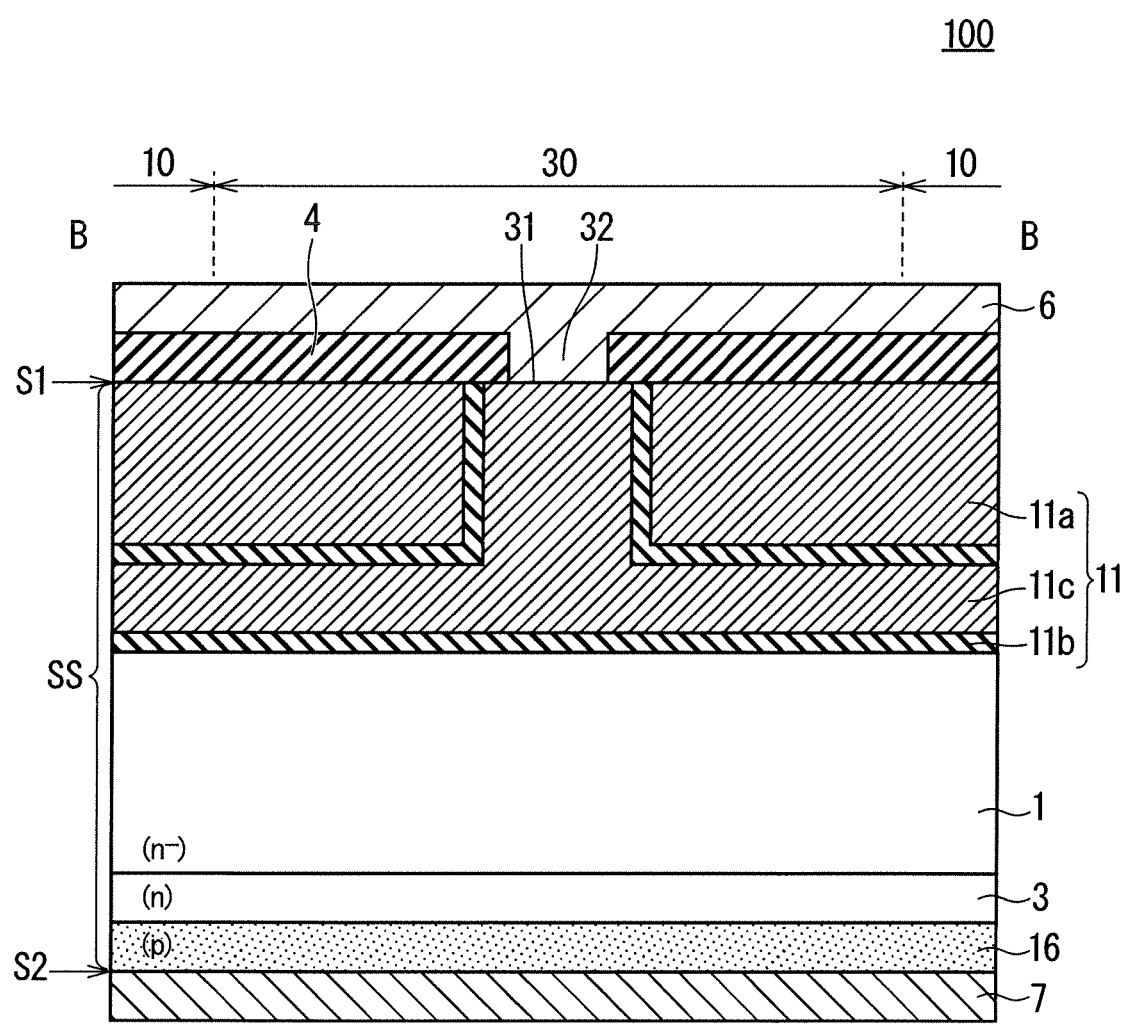
FIG. 5 is a partial cross-sectional view of the reverse conducting IGBT according to the embodiment 1 of the present disclosure.

4 is a cross-sectional view along an A-A line viewed from an arrow direction in a plan view of the region 80 illustrated in FIG. 3, and FIG. 5 is a cross-sectional view along a B-B line viewed from an arrow direction.

Figure 6:
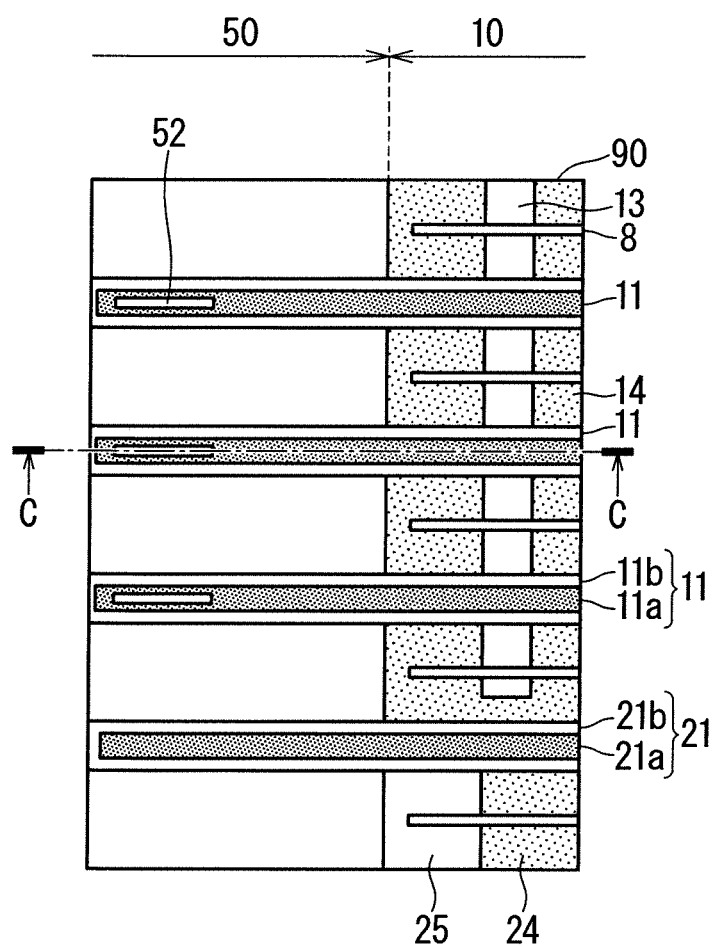
FIG. 6 is a partial plan view of the reverse conducting IGBT according to the embodiment 1 of the present disclosure.
Figure 7:
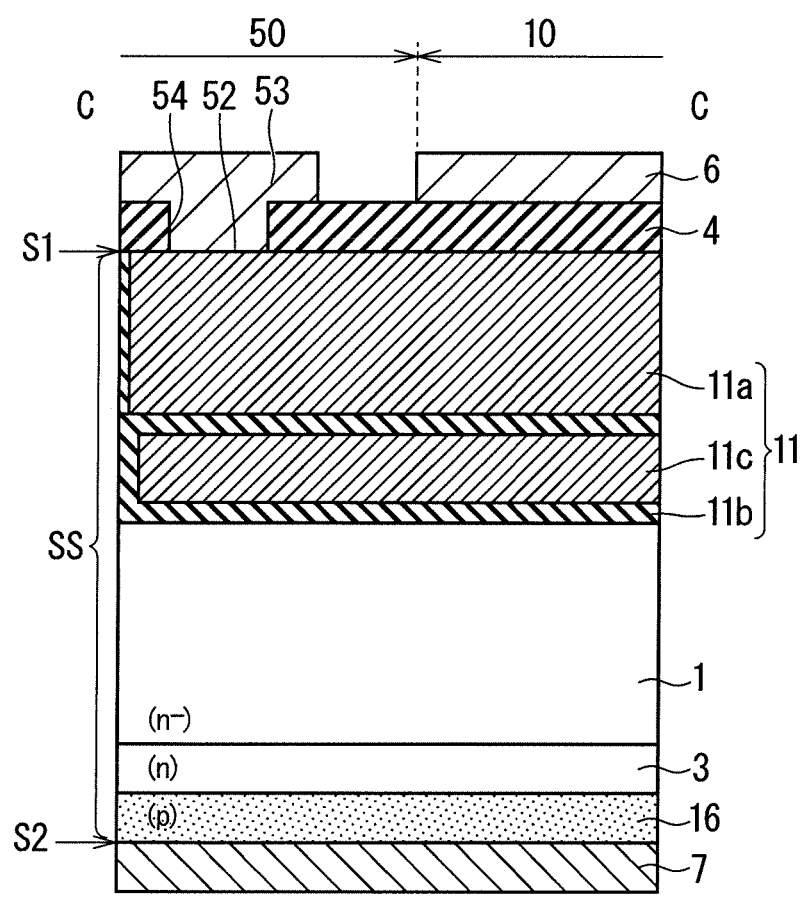
FIG. 7 is a partial cross-sectional view of the reverse conducting IGBT according to the embodiment 1 of the present disclosure.
Figure 8:
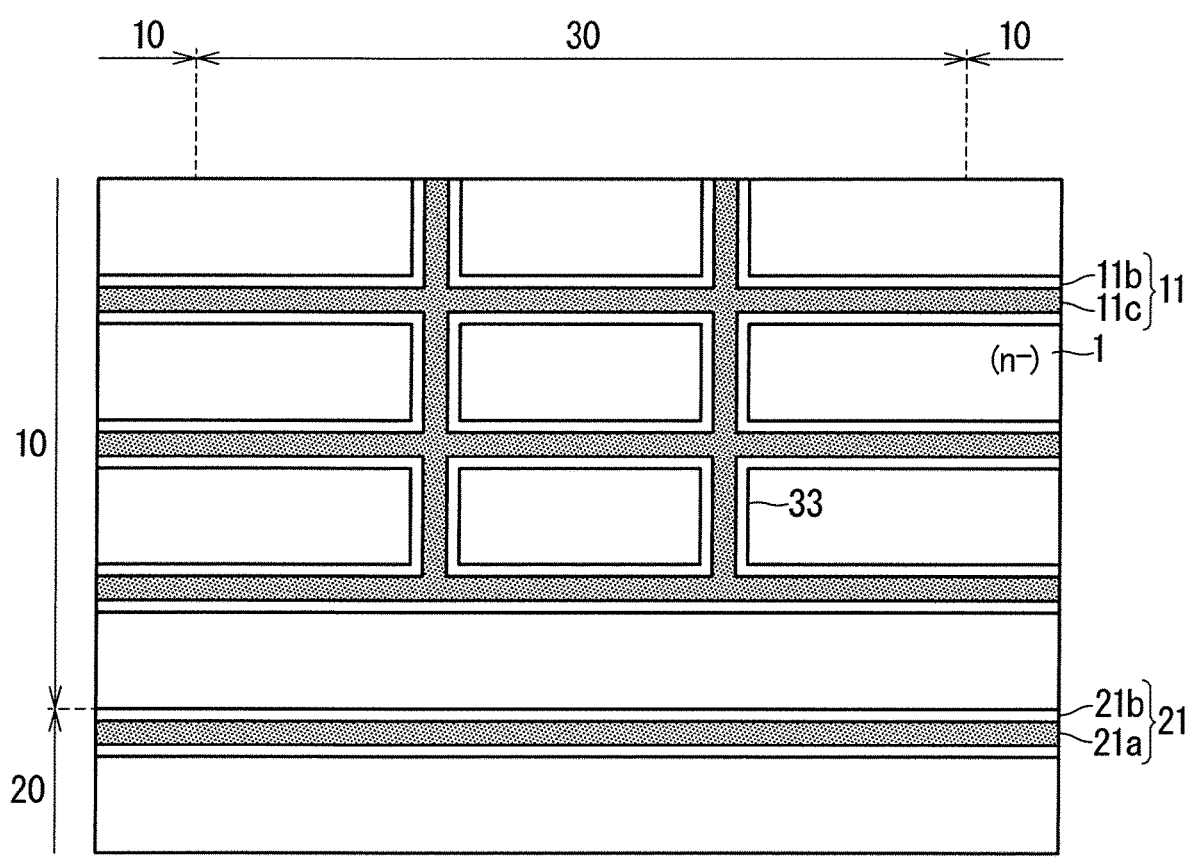
FIG. 8 is a partial cross-sectional view of the reverse conducting IGBT according to the embodiment 1 of the present disclosure.

FIG. 6 is a plan view of enlarging a region 90 enclosed by a broken line in the RC-IGBT 100 illustrated in FIG. 1, and FIG. 7 is a cross-sectional view along a C-C line viewed from an arrow direction in a plan view of the region 90 illustrated in FIG. 6. FIG. 8 is a plan view along an X-X line viewed from an arrow direction in the cross-sectional view in FIG. 4.

As illustrated in FIG. 3, in the embedded electrode extraction region 30, a gate intersection trench gate 33 perpendicular to the active trench gates 11 is provided to connect the active trench gates 11 (first trench gates) facing each other. The gate intersection trench gate 33 is provided with a space to intersect with each active trench gate 11 at two points, and a cross-sectional structure thereof is similar to that of the active trench gate 11.

An embedded electrode contact 32 is provided to the active trench gate 11 by opening the interlayer insulating film between the gate intersection trench gates 33, and an embedded electrode extraction part 31 extending from the embedded electrode is exposed to a bottom part thereof. In FIG. 3, the emitter electrode is omitted for descriptive purposes.

As illustrated in FIG. 3, in the diode region 20, diode trench gates 21 are provided in a stripe form in parallel to the active trench gate 11, and a $p^+$ type diode contact layer 24 is formed in at least a part of a p-type anode layer 25 (seventh semiconductor layer). Diode contact 28 is provided in a stripe form in parallel to the diode trench gate 21 to pass across the anode layer 25 and the diode contact layer 24.

As illustrated in FIG. 3, the embedded electrode extraction region 30 is disposed in the IGBT region 10, thus an invalid region can be reduced compared with a case where the embedded electrode extraction region 30 is disposed in the wiring region 50.

Figure 4:
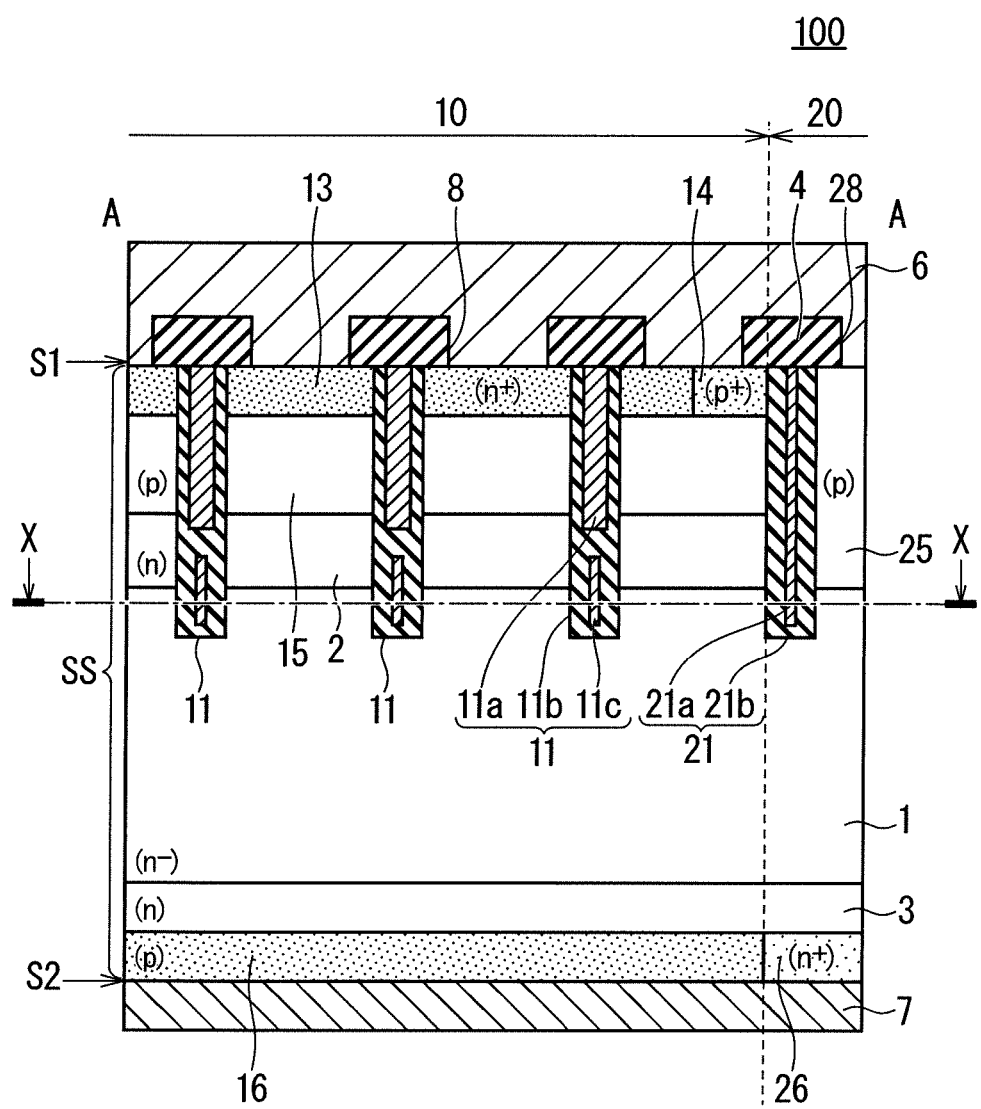
FIG. 4 is a partial cross-sectional view of the reverse conducting IGBT according to the embodiment 1 of the present disclosure.

A cross-sectional configuration of the region 80 is described next using FIG. 4 and FIG. 5. As illustrated in FIG. 4, the IGBT region 10 and the diode region 20 in the RC-IGBT 100 are formed in a semiconductor substrate SS. An upper end of the semiconductor substrate SS in a paper sheet is referred to as a first main surface, and a lower end of the semiconductor substrate SS in a paper sheet is referred to as a second main surface. A first main surface S1 of the semiconductor substrate SS is a main surface on a front surface side of the RC-IGBT, and a second main surface S2 of the semiconductor substrate SS is a main surface on a back surface side of the RC-IGBT 100.

As illustrated in FIG. 4, the RC-IGBT 100 includes an $n^-$-type drift layer 1 (first semiconductor layer) between the first main surface S1 and the second main surface in the IGBT region 10 as a cell region. The drift layer 1 is a semiconductor layer having arsenic (As) or phosphorus (P), for example, as an n-type impurity, and an n-type carrier accumulation layer 2 (second semiconductor layer) having a higher concentration of the n-type impurity than the drift layer 1 is provided on a side of the first main surface S1 of the drift layer 1. The carrier accumulation layer 2 is a semiconductor layer having arsenic or phosphorus, for example, as the n-type impurity.

As illustrated in FIG. 4, a p-type base layer 15 (third semiconductor layer) is provided on the side of the first main surface S1 of the carrier accumulation layer 2. The p-type base layer 15 is a semiconductor layer having boron (B) or aluminum (Al), for example, as a p-type impurity. The base layer 15 has contact with a trench gate insulating film 11b (first gate insulating film) of the active trench gate 11. An $n^+$-type emitter layer 13 (four semiconductor layer) is provided on the side of the first main surface S1 of the base layer 15 to have contact with the trench gate insulating film 11b of the active trench gate 11, and a $p^+$-type IGBT contact layer 14 (fifth semiconductor layer) is provided in a remaining region. The emitter layer 13 is a semiconductor layer having arsenic or phosphorus, for example, as an n-type impurity, the IGBT contact layer 14 is a semiconductor layer having boron or aluminum, for example, as a p-type impurity, and the emitter layer 13 and the IGBT contact layer 14 constitute the first main surface S1 of the semiconductor substrate SS.

As illustrated in FIG. 4, an n-type buffer layer 3 having a higher concentration of the n-type impurity than the drift layer 1 is provided on the side of the second main surface S2 of the drift layer 1. The buffer layer 3 is provided to suppress punch-through of a depletion layer extending from the base layer 15 to the side of the second main surface S2 when the RC-IGBT 100 is in an off state. The buffer layer 3 is formed by implanting phosphorus or proton ($H^+$), for example, and also can be formed by implanting both phosphorus and proton.

As illustrated in FIG. 4, a p-type collector layer 16 (fifth semiconductor layer) is provided on the side of the second main surface S2 of the buffer layer 3 in the IGBT region 10. That is to say, the collector layer 16 is provided between the buffer layer 3 and the second main surface S2. The collector layer 16 is a semiconductor layer having boron or aluminum, for example, as a p-type impurity, and the collector layer 16 constitutes the second main surface S2 of the semiconductor substrate SS.

A trench passing through the base layer 15 from the first main surface S1 of the semiconductor substrate SS to reach the drift layer 1 is formed in the IGBT region 10. A trench gate electrode 11a (second gate electrode) is provided in the trench via the trench gate insulating film 11b, and an embedded electrode 11c (first gate electrode) is provided on the side of the second main surface S2 of the trench gate electrode 11a to constitute the active trench gate 11. The embedded electrode 11c faces the drift layer 1 via the trench gate insulating film 11b. A bottom part of the trench gate electrode 11a is located closer to the side of the second main surface S2 in relation to the base layer 15.

The trench gate insulating film 11b of the active trench gate 11 has contact with the base layer 15 and the emitter layer 13. When gate drive voltage is applied to the trench gate electrode 11a, a channel is formed in the p-type base layer 15 having contact with the trench gate insulating film 11b of the active trench gate 11.

As illustrated in FIG. 4, an interlayer insulating film 4 is provided on the trench gate electrode 11a of the active trench gate 11. A barrier metal can also be formed on a region where the interlayer insulating film 4 is not provided on the first main surface S1 of the semiconductor substrate SS and on the interlayer insulating film 4. The barrier metal may be a conductor including titanium (Ti), titanium nitride, or TiSi in which titanium and silicon (Si) are alloyed, for example.

As illustrated in FIG. 4, an emitter electrode 6 (first main electrode) is provided on an IGBT contact 8 provided to the interlayer insulating film 4 of the first main surface S1 and the interlayer insulating film 4. The emitter electrode 6 may be formed of aluminum alloy such as aluminum silicon alloy (Al—Si Series alloy), for example, or may also be an electrode made up of a metal film of a plurality of layers in which a plating film is formed by a non-electrolytic plating or an electrolytic plating on an electrode formed of aluminum alloy. A front metal may be formed on the emitter electrode 6 by plating, for example. The front metal is formed in a part of a region in the emitter electrode 6 in a plan view, and is used as a bonding surface between the emitter electrode 6 and a solder when a direct lead bonding (DLB) structure of directly bonding a semiconductor chip and a main terminal with a solder is adopted. The front metal is used to increase heat radiation properties.

As illustrated in FIG. 4, the RC-IGBT 100 includes the n'-type drift layer 1 also in the diode region 20 in the manner similar to the IGBT region 10. The drift layer 1 of the diode region 20 and the drift layer 1 of the IGBT region 10 are continuously and integrally formed, and are formed by the same semiconductor substrate SS.

As illustrated in FIG. 4, the n-type buffer layer 3 is provided on the side of the second main surface S2 of the drift layer 1 also in the diode region 20 in the manner similar to the IGBT region 10. The buffer layer 3 provided to the diode region 20 has the same configuration as the buffer layer 3 provided to the IGBT region 10.

A p-type anode layer 25 (seventh semiconductor layer) is provided on the side of the first main surface S1 of the drift layer 1. The anode layer 25 is provided between the drift layer 1 and the first main surface S1. The anode layer 25 and the base layer 15 can be formed at the same time by making the anode layer 25 have the same concentration of the p-type impurity as the base layer 15 of the IGBT region 10. The anode layer 25 constitutes the first main surface S1 of the semiconductor substrate SS.

An $n^+$-type cathode layer 26 (first semiconductor layer) is provided on the side of the second main surface S2 of the buffer layer 3 in the diode region 20. The cathode layer 26 is provided between the drift layer 1 and the second main surface S2. The cathode layer 26 is a semiconductor layer having arsenic or phosphorus as an n-type impurity, for example, and constitutes the second main surface S2 of the semiconductor substrate SS.

As illustrated in FIG. 4, formed in the diode region 20 is a trench passing through the anode layer 25 from the first main surface S1 of the semiconductor substrate SS to reach the drift layer 1. A diode trench electrode 21a is provided in the trench in the diode region 20 via a diode trench insulating film 21b, thus the diode trench gate 21 is formed. The diode trench electrode 21a faces the drift layer 1 via the diode trench insulating film 21b.

As illustrated in FIG. 4, the interlayer insulating film 4 is provided on the diode trench electrode 21a of the diode trench gate 21. A barrier metal can also be formed on a region where the interlayer insulating film 4 is not provided on the first main surface S1 of the semiconductor substrate SS and on the interlayer insulating film 4.

As illustrated in FIG. 4, the emitter electrode 6 is provided on a region where the interlayer insulating film 4 is not provided on the first main surface S1 of the diode region 20 and on the interlayer insulating film 4. The emitter electrode 6 is formed continuously with the emitter electrode 6 provided to the IGBT region 10. The emitter electrode 6 has contact with the anode layer 25, and also functions as an anode electrode.

As illustrated in FIG. 4, a collector electrode 7 (second main electrode) is provided on the side of the second main surface S2 of the cathode layer 26. The collector electrode 7 in the diode region 20 is formed continuously with the collector electrode 7 provided to the IGBT region 10 in the manner similar to the emitter electrode 6. The collector electrode 7 has contact with the cathode layer 26, and also functions as a cathode electrode.

As illustrated in FIG. 5, the embedded electrode extraction region 30 of the RC-IGBT 100 is disposed to be sandwiched between the IGBT regions 10, a part of the trench gate electrode 11a is disconnected, and the embedded electrode extraction part 31 connected to the embedded electrode 11c in the disconnected part is formed. The embedded electrode contact 32 (first contact) is formed by opening the interlayer insulating film 4 in an upper part of the embedded electrode extraction part 31, and the embedded electrode contact 32 is filled with the emitter electrode 6, thus the embedded electrode extraction part 31 and the emitter electrode 6 are connected to each other, and the embedded electrode 11c is electrically connected to the emitter electrode 6.

As illustrated in FIG. 6, the wiring region 50 of the RC-IGBT 100 is formed continuously with the IGBT region 10, and a gate electrode extraction part 52 is formed on an end portion of the active trench gate 11. In FIG. 6, the emitter electrode and the gate wiring electrode are omitted for descriptive purposes.

As illustrated in FIG. 7, the gate electrode extraction part 52 is a part of the trench gate electrode 11a exposed to a bottom part of a gate electrode contact 54 provided by opening a part of the interlayer insulating film 4. The gate electrode extraction part 52 is connected to a gate wiring electrode 53 provided on the interlayer insulating film 4 via the gate electrode contact 54, and the gate wiring electrode 53 and the trench gate electrode 11a are electrically connected to each other.

The active trench gate 11 has a two-stage structure having two electrodes of the trench gate electrode 11a and the embedded electrode 11c, that is to say, a split gate structure inside. Both the trench gate electrode 11a and the embedded electrode 11c need to be connected to the emitter potential to hold a withstand voltage between the collector and the emitter in an off state.

That is to say, the RC-IGBT 100 includes the carrier accumulation layer 2, and two active trench gates 11 need to be the emitter potential to deplete a region between both active trench gates 11. Thus, if the embedded electrode 11c is a plus potential, that is to say, a gate potential or a floating potential, for example, the carrier accumulation layer 2 is not depleted, electrical field is concentrated between the active trench gates 11, and the withstand voltage decreases.

Accordingly, if any one of the trench gate electrode 11a and the embedded electrode 11c becomes a floating potential by a defect in forming a contact, for example, the withstand voltage decreases. However, the RC-IGBT 100 includes the gate intersection trench gate 33, thus all of the embedded electrodes 11c are connected to each other in the IGBT region 10 as with FIG. 8 illustrating the arrangement of the embedded electrodes 11c in a plan view. Accordingly, when even one embedded electrode extraction part 31 is formed, all of the embedded electrodes 11c can be electrically connected to the emitter electrode 6, and a withstand voltage defect can be reduced.

Modification Example

Figure 9:
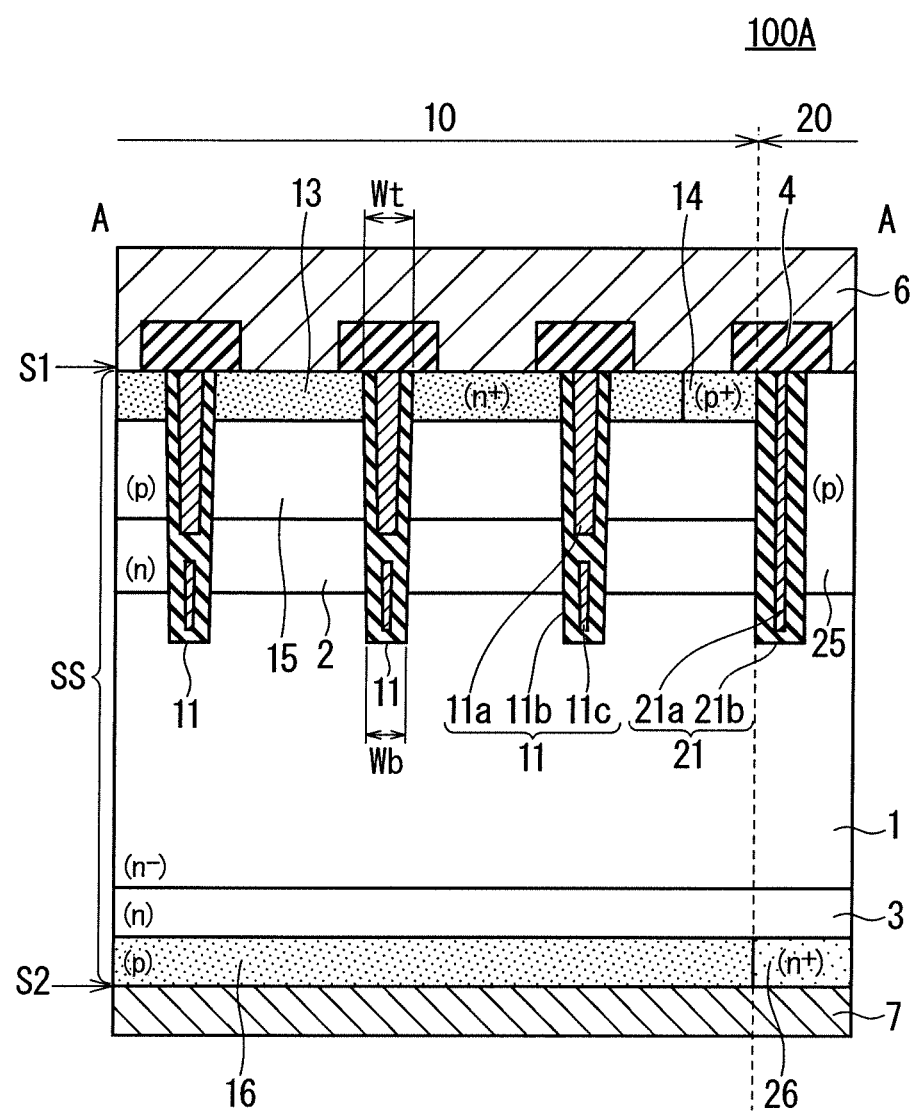
FIG. 9 is a partial cross-sectional view of a modification example of the reverse conducting IGBT according to the embodiment 1 of the present disclosure.
Figure 10:
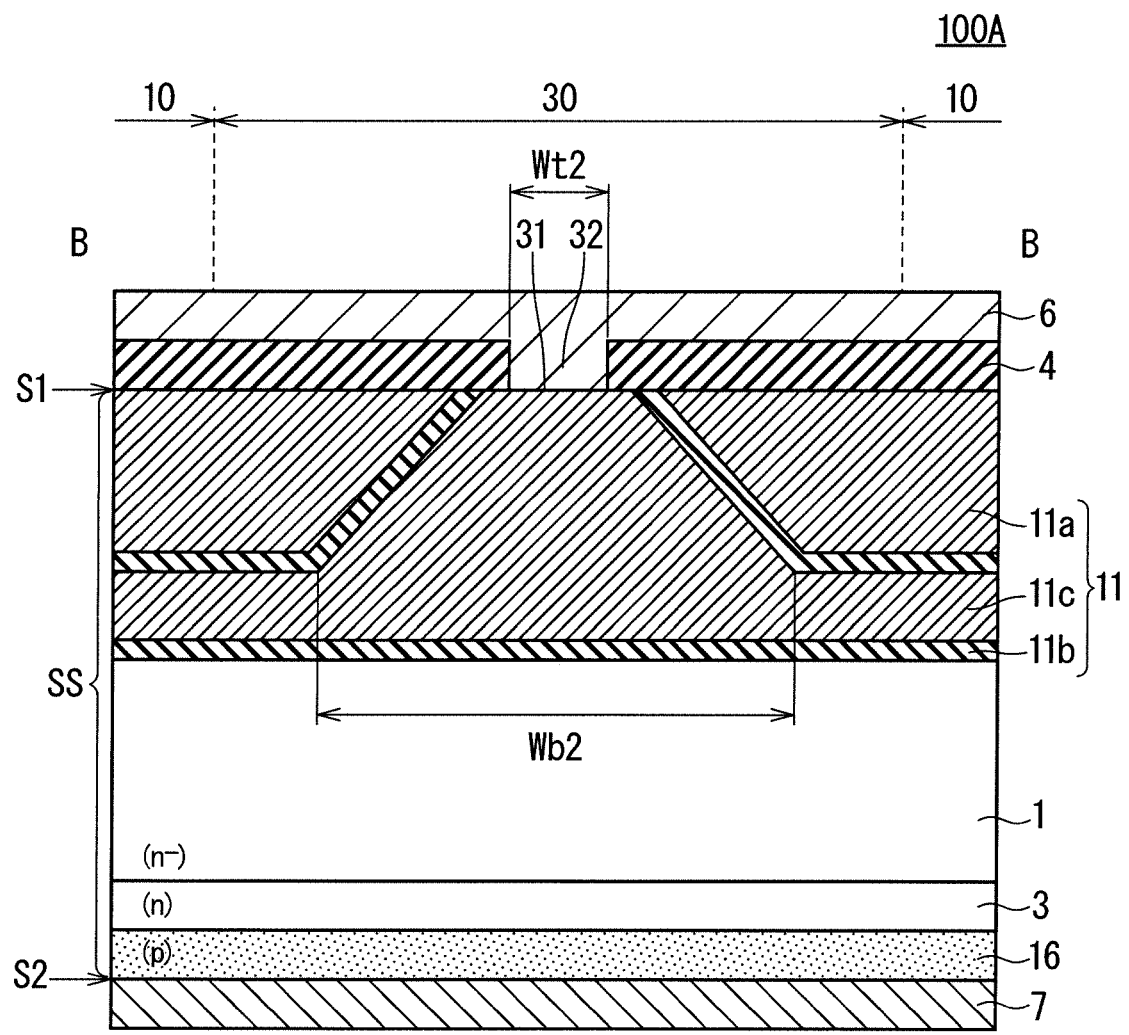
FIG. 10 is a partial cross-sectional view of a modification example of the reverse conducting IGBT according to the embodiment 1 of the present disclosure.

Described next in FIG. 9 and FIG. 10 is a configuration of an RC-IGBT 100A as a modification example of the embodiment 1. FIG. 9 and FIG. 10 are cross-sectional views corresponding to FIG. 4 and FIG. 5, respectively.

As illustrated in FIG. 9, in the RC-IGBT 100A, the active trench gate 11 has a tapered shape in which a width Wb of a bottom part on the side of the second main surface S2 is smaller than a width Wt of an opening part on the side of the first main surface S1. When such a shape is adopted, an aspect ratio of the trench is reduced, and embedding properties of the trench gate electrode 11a and the embedded electrode 11c can be improved.

As illustrated in FIG. 10, in the RC-IGBT 100A, the embedded electrode extraction part 31 has a tapered shape in which a width Wb2 of a bottom part on the side of the embedded electrode 11c is larger than a width Wt2 of the embedded electrode contact 32.

By adopting such a shape, an angle of a boundary between the trench gate electrode 11a and the embedded electrode 11c is 90 degrees or more, thus a shape of the boundary is smooth and can suppress an electrical field concentration, and reliability of the gate can be improved.

Embodiment 2

An RC-IGBT 101 according to an embodiment 2 of the present disclosure is described next. An upper surface configuration of the whole RC-IGBT 101 is the same as that of the RC-IGBT 100 illustrated in FIG. 1, thus there is a case of describing the upper surface configuration thereof by citing FIG. 1.

Figure 11:
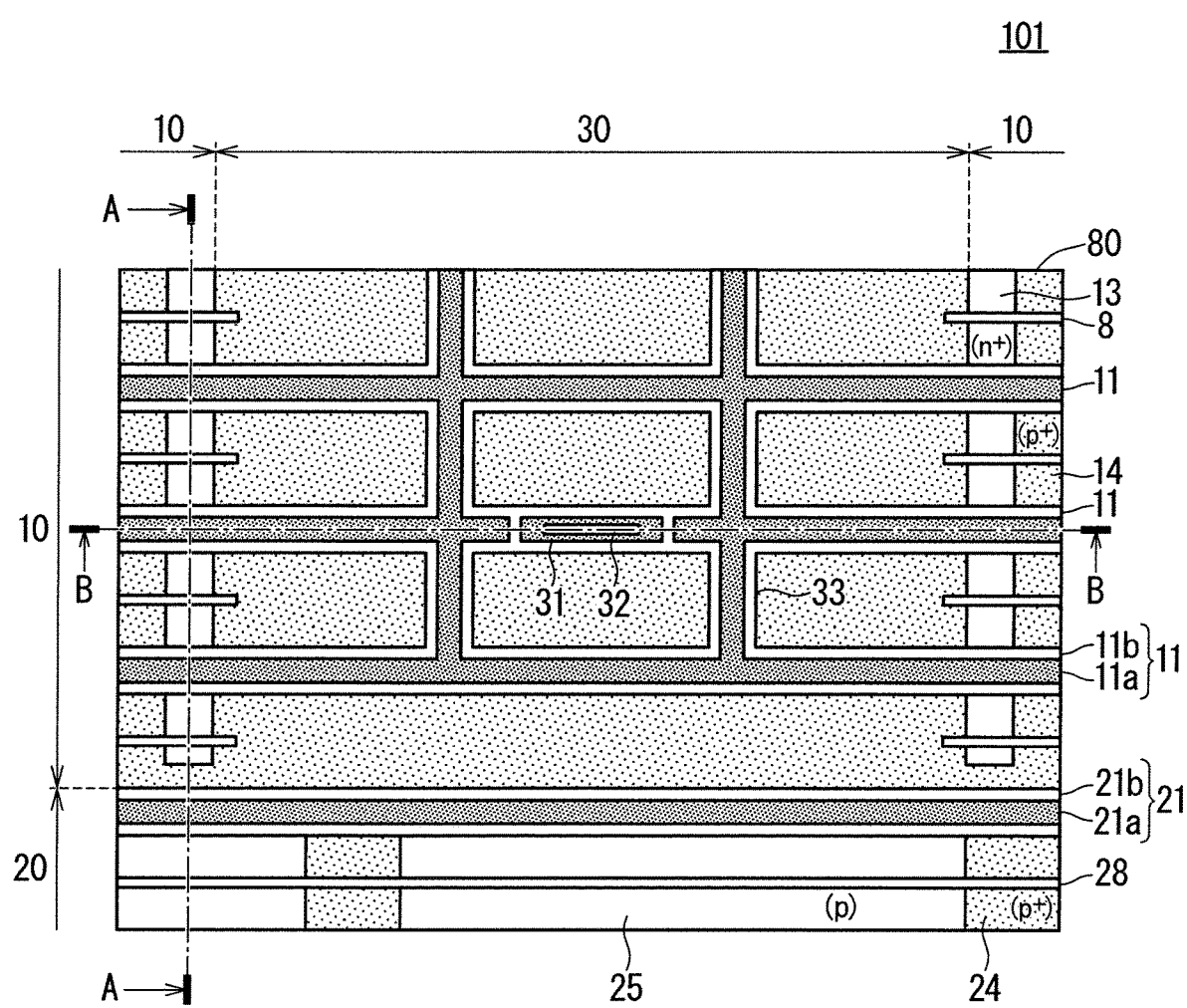
FIG. 11 is a partial plan view of a reverse conducting IGBT according to an embodiment 2 of the present disclosure.
Figure 12:
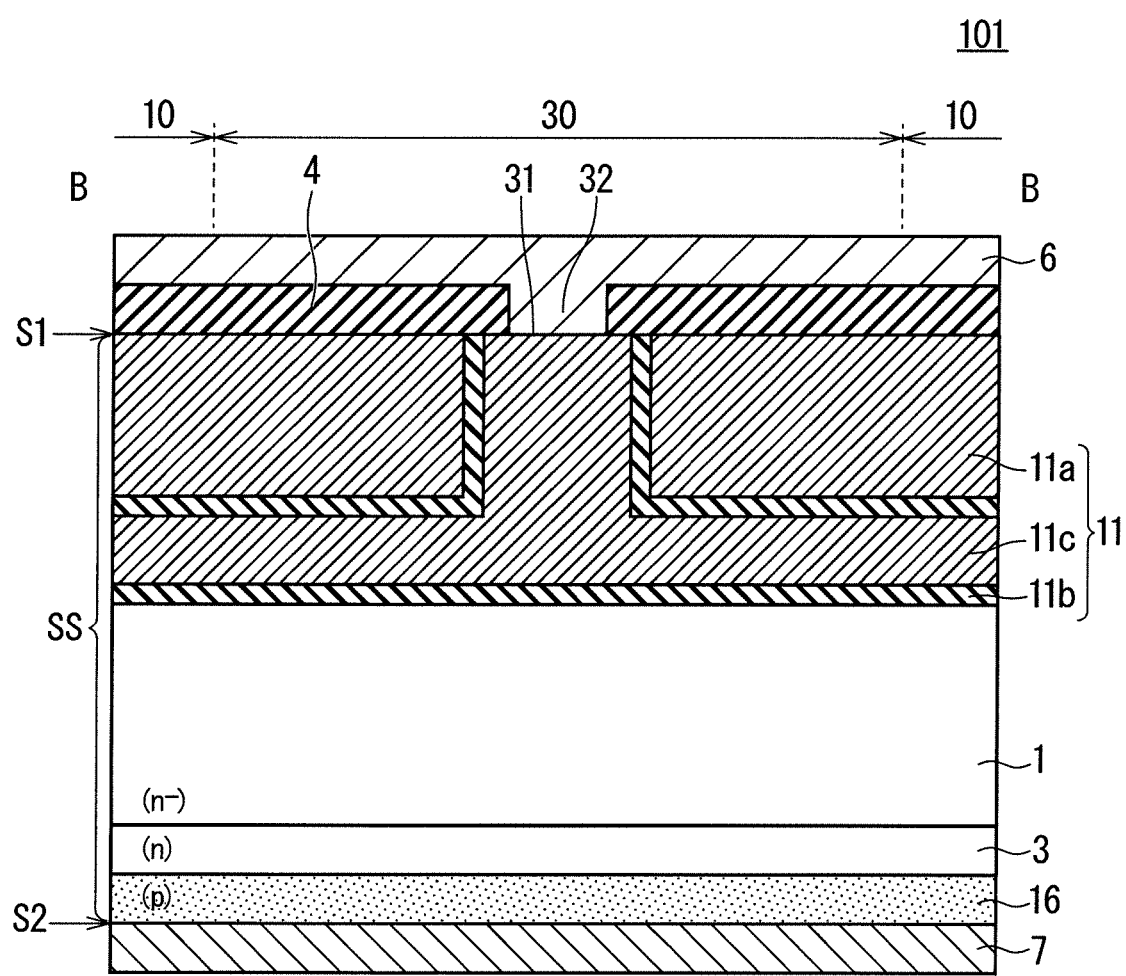
FIG. 12 is a partial cross-sectional view of the reverse conducting IGBT according to the embodiment 2 of the present disclosure.

FIG. 11 is a plan view of enlarging the region 80 enclosed by a broken line in FIG. 1, and FIG. 12 is a cross-sectional view along a B-B line viewed from an arrow direction in a plan view of the region 80 illustrated in FIG. 11. The cross-sectional view along the A-A line viewed from the arrow direction in FIG. 11 is the same as that in FIG. 4.

As illustrated in FIG. 11, the RC-IGBT 101 has a configuration that the embedded electrode extraction part 31 is not formed in some active trench gate 11 in the embedded electrode extraction region 30. By adopting such a configuration, a part where a gate current route is blocked is reduced between the wiring regions 50 (FIG. 1) disposed on right and left sides of the active region AR (FIG. 1). That is to say, the active trench gate 11 where the embedded electrode extraction part 31 is not formed is connected to the wiring region 50 on right and left sides not shown in FIG. 11 via the embedded electrode extraction region 30 and the IGBT regions 10 on right and left sides thereof, and the active trench gate 11 does not include a disconnected part.

The trench gate electrode 11a itself also has a resistance, thus a potential distribution occurs in the trench gate electrode 11a. In this case, when the embedded electrode extraction part 31 is provided to all of the active trench gates 11, there is a possibility that the gate current route flowing from the left side to the right side or from the right side to the left side is blocked in the embedded electrode extraction part 31 as illustrated in FIG. 12, the potential distribution in the trench gate electrode 11a is not balanced on the right and left sides, an operation is unbalanced in the semiconductor chip, and the withstand voltage is reduced.

However, when the embedded electrode extraction part 31 is not formed in some active trench gate 11, the trench gate electrode 11a in which the potential distribution is not balanced on the right and left sides can be reduced, thus the state where the operation is unbalanced in the semiconductor chip can be suppressed.

When the embedded electrode extraction part 31 is provided to at least one active trench gate 11, all of the embedded electrodes 11c can be electrically connected to the emitter electrode 6 by the arrangement of the embedded electrode 11c in a plan view illustrated in FIG. 8.

Embodiment 3

An RC-IGBT 102 according to an embodiment 3 of the present disclosure is described next. An upper surface configuration of the whole RC-IGBT 102 is the same as that of the RC-IGBT 100 illustrated in FIG. 1, thus there is a case of describing the upper surface configuration thereof by citing FIG. 1.

Figure 13:
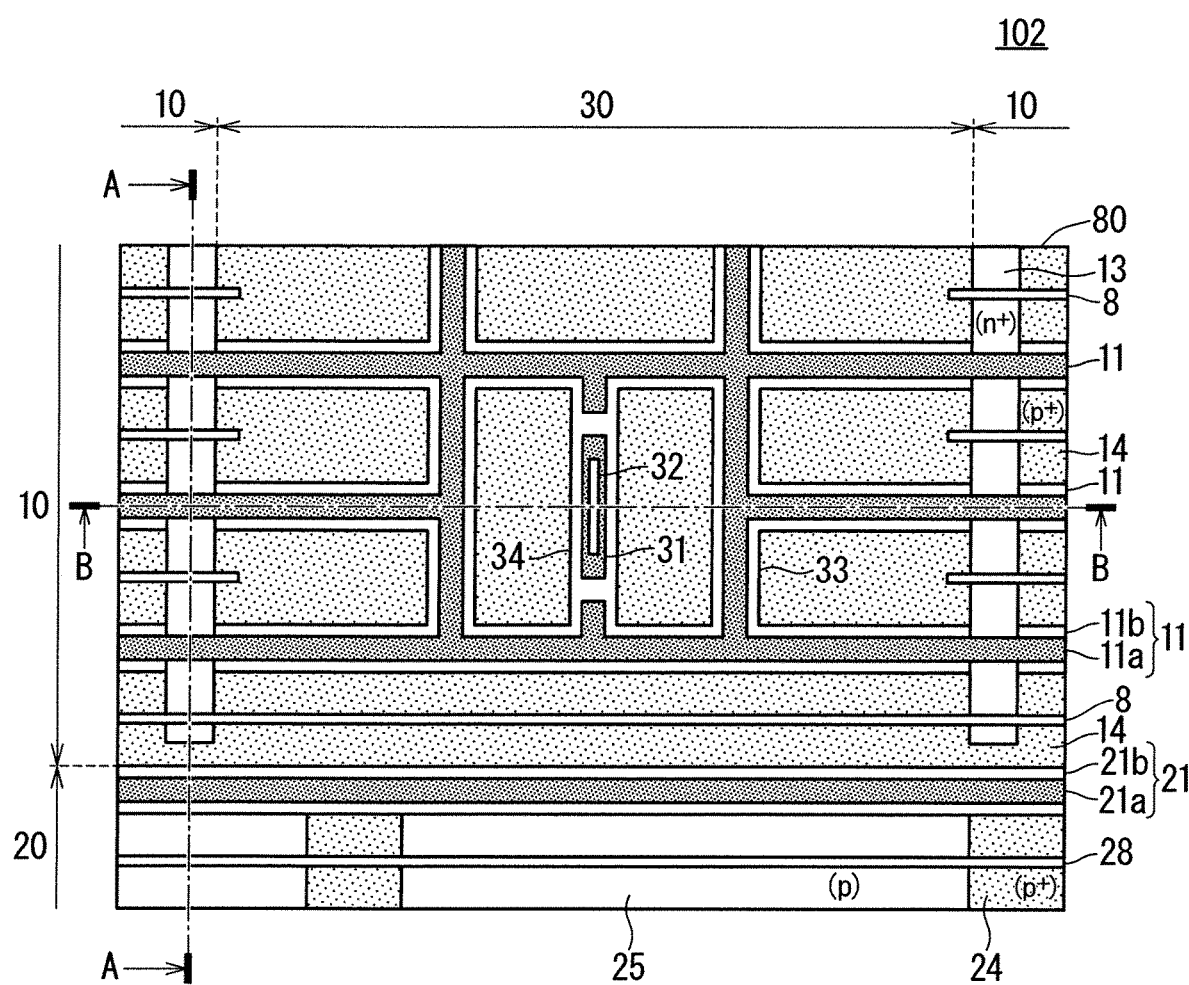
FIG. 13 is a partial plan view of a reverse conducting IGBT according to an embodiment 3 of the present disclosure.
Figure 14:
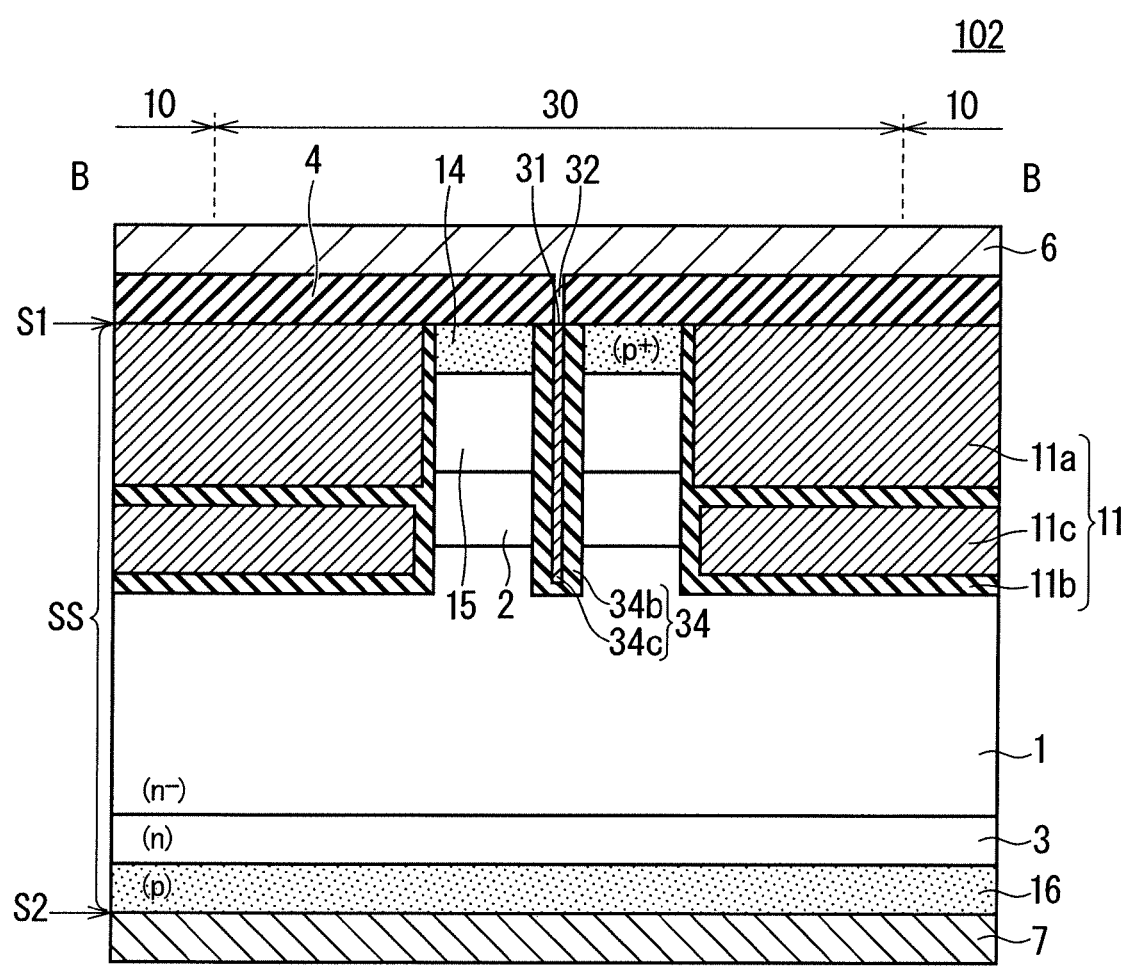
FIG. 14 is a partial cross-sectional view of the reverse conducting IGBT according to the embodiment 3 of the present disclosure.

FIG. 13 is a plan view of enlarging the region 80 enclosed by a broken line in FIG. 1, and FIG. 14 is a cross-sectional view along a B-B line viewed from an arrow direction in a plan view of the region 80 illustrated in FIG. 13. The cross-sectional view along the A-A line viewed from the arrow direction in FIG. 13 is the same as that in FIG. 4.

As illustrated in FIG. 13, the gate intersection trench gate 33 is provided to connect three active trench gates 11 in the embedded electrode extraction region 30 in the RC-IGBT 102. The gate intersection trench gates 33 are provided at intervals so as to intersect at two points of first and third active trench gates 11 from a side of the diode region 20. The second active trench gate 11 from the side of the diode region 20 is disconnected in the gate intersection trench gates 33 on the right and left sides, and intersect with the gate intersection trench gate 33 at the disconnected part.

An embedded electrode intersection trench gate 34 parallel to the gate intersection trench gate 33 is disposed between the gate intersection trench gates 33 on the right and left sides, and the embedded electrode intersection trench gate 34 intersects with the active trench gates 11 on upper and lower sides. The embedded electrode extraction part 31 and the embedded electrode contact 32 are provided to the embedded electrode intersection trench gate 34.

As illustrated in FIG. 14, a cross-sectional structure of the embedded electrode intersection trench gate 34 is made up of a trench gate insulating film 34b (second gate insulating film) covering an inner surface of the trench and a trench gate electrode 34c (third gate electrode) embedded in the trench via the trench gate insulating film 34b, and the embedded electrode extraction part 31 is a part of a trench gate electrode 34c exposed to the bottom part of the embedded electrode contact 32 provided by opening a part of the interlayer insulating film 4. The trench gate electrode 34c is connected to the embedded electrode 11c of the active trench gates 11 on the upper and lower sides.

By adopting such a configuration, a part where the gate current route is blocked is reduced between the wiring regions 50 (FIG. 1) disposed on the right and left sides of the active region AR (FIG. 1). That is to say, the active trench gates 11 on the upper and lower sides of the embedded electrode intersection trench gate 34 is connected to the wiring region 50 on the right and left sides not shown in FIG. 14 via the embedded electrode extraction region 30 and the IGBT regions 10 on the right and left sides thereof, and the active trench gate 11 does not include a disconnected part.

Thus, the trench gate electrode 11a in which the potential distribution is not balanced on the right and left sides can be reduced, and the state where the operation is unbalanced in the semiconductor chip can be suppressed.

The embedded electrode intersection trench gate 34 is provided, thus an occupation width of the embedded electrode contact 32 in the right-left direction, that is to say, the active trench gate 11 in the extension direction can be reduced, and a width of the embedded electrode extraction region 30 in the right-left direction can be reduced.

When at least one embedded electrode intersection trench gate 34 is provided to the embedded electrode extraction region 30, all of the embedded electrodes 11c can be electrically connected to the emitter electrode 6.

As illustrated in FIG. 13, the IGBT contact 8 extending in parallel to the diode trench gate 21 is provided to the IGBT contact layer 14 adjacent to the diode trench gate 21 in the embedded electrode extraction region 30 of the RC-IGBT 102.

Embodiment 4

An RC-IGBT 103 according to an embodiment 4 of the present disclosure is described next. An upper surface configuration of the whole RC-IGBT 103 is the same as that of the RC-IGBT 100 illustrated in FIG. 1, thus there is a case of describing the upper surface configuration thereof by citing FIG. 1.

Figure 15:
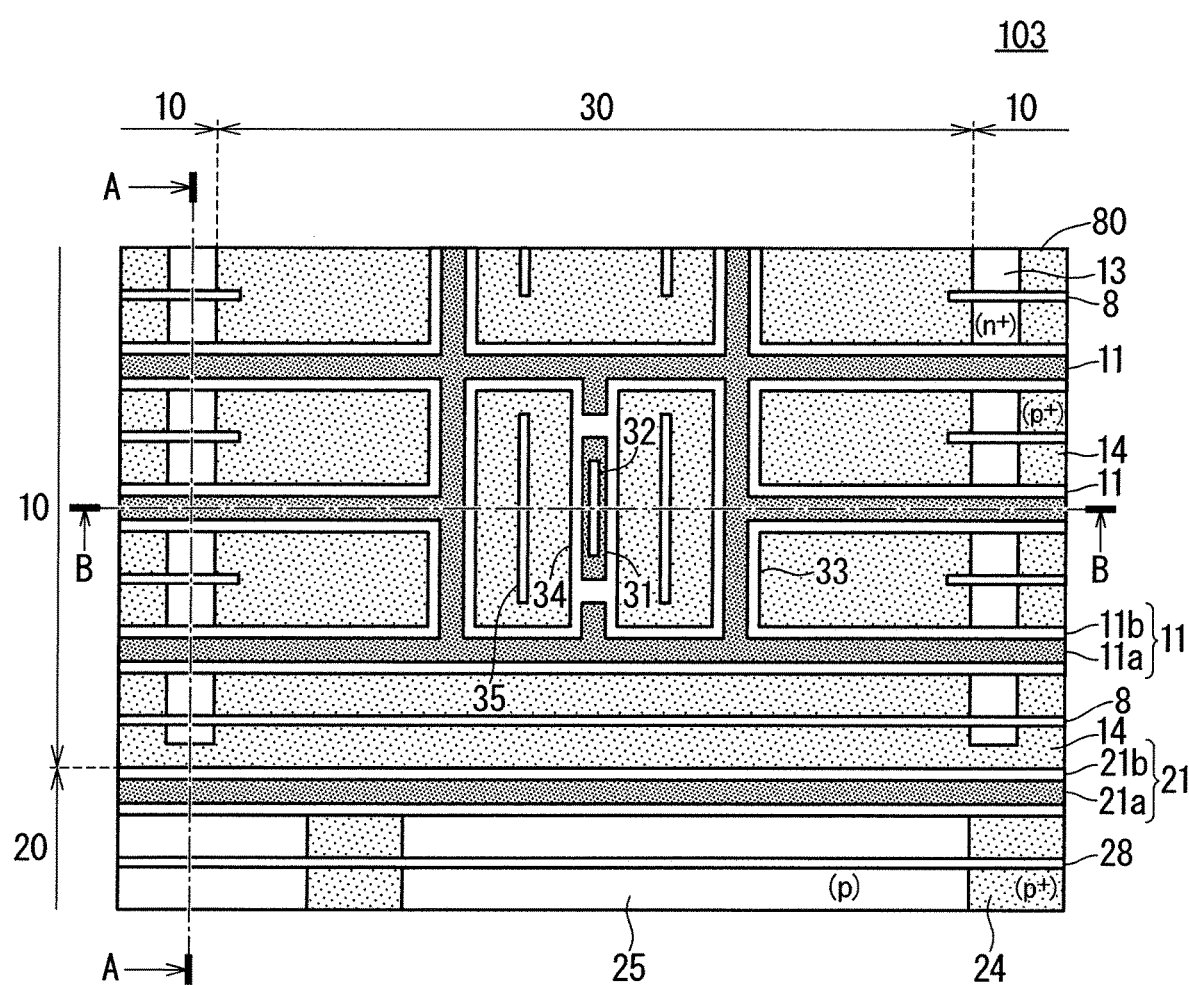
FIG. 15 is a partial plan view of a reverse conducting IGBT according to an embodiment 4 of the present disclosure.
Figure 16:
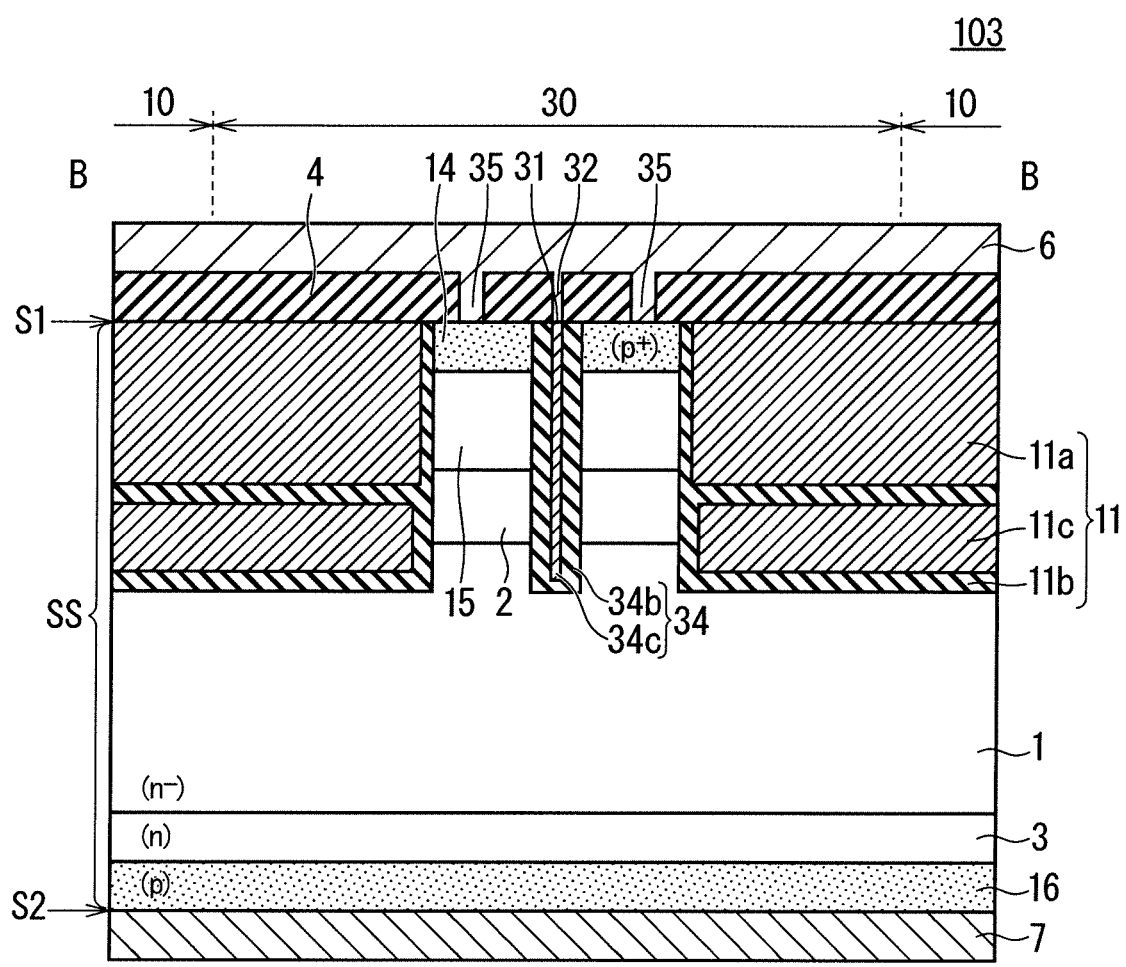
FIG. 16 is a partial cross-sectional view of the reverse conducting IGBT according to the embodiment 4 of the present disclosure.

FIG. 15 is a plan view of enlarging the region 80 enclosed by the broken line in FIG. 1, and FIG. 16 is a cross-sectional view along a B-B line viewed from an arrow direction in a plan view of the region 80 illustrated in FIG. 15. The cross-sectional view along the A-A line viewed from the arrow direction in FIG. 15 is the same as that in FIG. 4.

As illustrated in FIG. 15, a hole exhaust contact 35 (second contact) is disposed on the IGBT contact layer 14 between the gate intersection trench gate 33 and the embedded electrode intersection trench gate 34 in the embedded electrode extraction region 30 in the RC-IGBT 103. The hole exhaust contact 35 is provided in parallel to the gate intersection trench gate 33 and the embedded electrode intersection trench gate 34, and is provided in a stripe form extending in the up-down direction, that is to say, the arrangement direction of the active trench gate 11.

As illustrated in FIG. 16, the hole exhaust contact 35 is provided by opening the interlayer insulating film 4, and the emitter electrode 6 is connected to the IGBT contact layer 14 via the hole exhaust contact 35.

By adopting such a configuration, hole exhaust efficiency in the embedded electrode extraction region 30 can be increased, and a safe operating area (SOA) of short-circuit resistance, for example, can be improved. That is to say, when the potential of the base layer 15 on the side of the first main surface S1 increases and a parasitic thyristor is turned on while high voltage is applied between the collector and the emitter of the IGBT, that is to say, when a latch-up state occurs, the IGBT is damaged, thus the potential of the base layer 15 needs to be suppressed while the high voltage is applied to improve the SOA. The potential of the base layer 15 easily increases when a large amount of holes are accumulated therein, thus when the hole exhaust contact 35 is provided, the hole can be easily exhausted, and the potential of the base layer 15 can be suppressed to improve the SOA.

As illustrated in FIG. 15, the IGBT contact 8 extending in parallel to the diode trench gate 21 is provided to the IGBT contact layer 14 adjacent to the diode trench gate 21 in the embedded electrode extraction region 30 of the RC-IGBT 103.

In this manner, when the IGBT contact 8 is provided to the embedded electrode extraction region 30, the hole exhaust efficiency can be further increased, and the SOA of the short-circuit resistance, for example, can be further improved.

Embodiment 5

An RC-IGBT 104 according to an embodiment 5 of the present disclosure is described next. An upper surface configuration of the whole RC-IGBT 104 is the same as that of the RC-IGBT 100 illustrated in FIG. 1, thus there is a case of describing the upper surface configuration thereof by citing FIG. 1.

Figure 17:
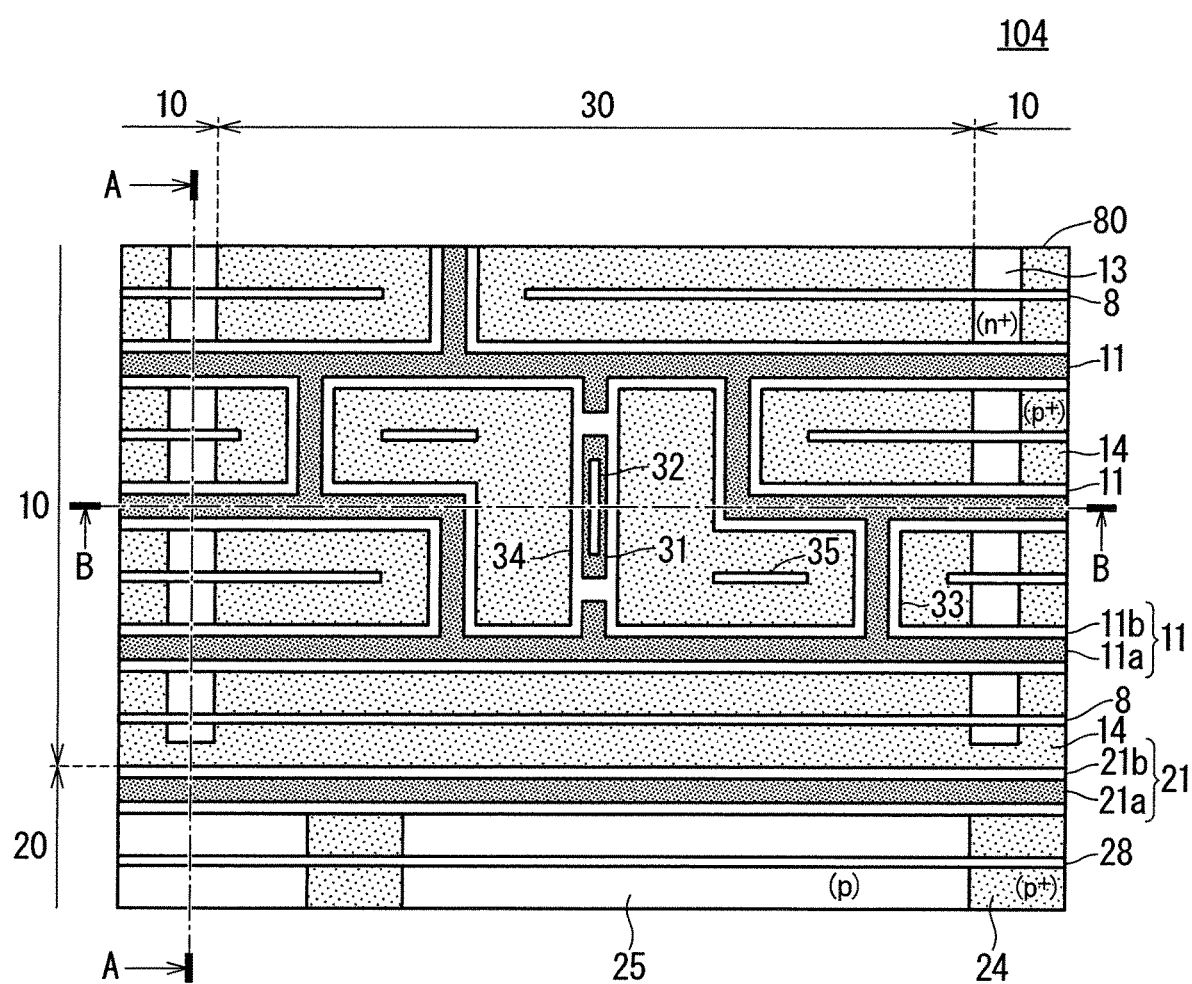
FIG. 17 is a partial plan view of a reverse conducting IGBT according to an embodiment 5 of the present disclosure.

FIG. 17 is a plan view of enlarging the region 80 enclosed by the broken line in FIG. 1. The cross-sectional view along the A-A line viewed from the arrow direction in FIG. 17 is the same as that in FIG. 4, and the cross-sectional view along the B-B line viewed from the arrow direction in FIG. 17 is the same as that in FIG. 14.

As illustrated in FIG. 17, the gate intersection trench gates 33 are disposed at intervals in the horizontal direction, that is to say, the extension direction of the active trench gate 11 for each pair of the active trench gates 11 facing each other in the embedded electrode extraction region 30 in the RC-IGBT 104.

Positions of two gate intersection trench gates 33 intersecting between the first and second active trench gates 11 from the side of diode region 20 deviate to the right side in the horizontal direction from positions of two gate intersection trench gates 33 intersecting between the second and third active trench gates 11 from the side of the diode region 20.

By adopting such a configuration, a crossing part where the active trench gate 11 and the gate intersection trench gate 33 intersect in a cross shape is not formed, but the active trench gates 11 can be connected to each other at only an L-like part and a T-like part where the active trench gate 11 and the gate intersection trench gate 33 intersect in an L-like shape and a T-like shape, thus embedding properties of the trench gate electrode 11a can be improved.

A maximum length of the trench gate electrode 11a in the crossing part is ($\sqrt{2}$)X in relation to a distance from a lower left corner to an upper right corner of the crossing part, that is to say, a width X of a trench opening part for embedding the trench gate electrode 11a. In the meanwhile, a maximum length of the trench gate electrode 11a in the L-like part or the T-like part is approximately ($\sqrt{2}$+1)X/2, thus the maximum length of the trench therein is smaller than that in the crossing part, and embedding properties of the trench gate electrode 11a can be improved.

As illustrated in FIG. 17, the IGBT contact 8 extends from the IGBT regions adjacent to each other to the IGBT contact layer 14 in the embedded electrode extraction region 30 in the RC-IGBT 104. The hole exhaust contact 35 is disposed on the IGBT contact layer 14 adjacent to the embedded electrode intersection trench gate 34. The hole exhaust contact 35 is provided in parallel to the active trench gate 11, and is provided in a stripe form extending in the right-left direction, that is to say, a direction horizontal to the extension direction of the active trench gate 11.

As illustrated in FIG. 17, the IGBT contact 8 extending in parallel to the diode trench gate 21 is provided to the IGBT contact layer 14 adjacent to the diode trench gate 21 in the embedded electrode extraction region 30 of the RC-IGBT 104.

In this manner, when the IGBT contact 8 and the hole exhaust contact 35 are provided to the embedded electrode extraction region 30, the hole exhaust efficiency can be increased, and the SOA of the short-circuit resistance, for example, can be improved.

Embodiment 6

An RC-IGBT 105 according to an embodiment 6 of the present disclosure is described next. An upper surface configuration of the whole RC-IGBT 105 is the same as that of the RC-IGBT 100 illustrated in FIG. 1, thus there is a case of describing the upper surface configuration thereof by citing FIG. 1.

Figure 18:
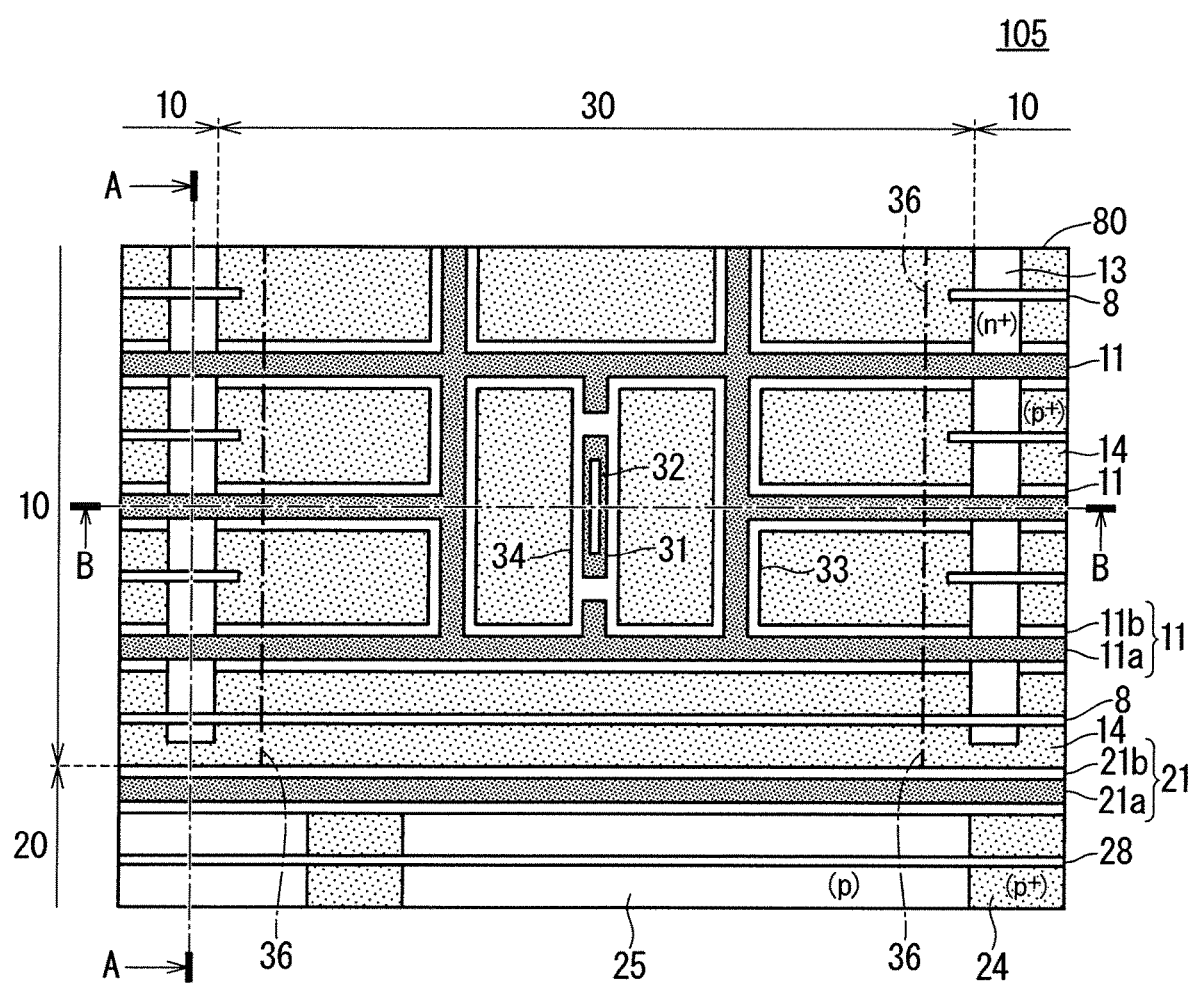
FIG. 18 is a partial plan view of a reverse conducting IGBT according to an embodiment 6 of the present disclosure.
Figure 19:
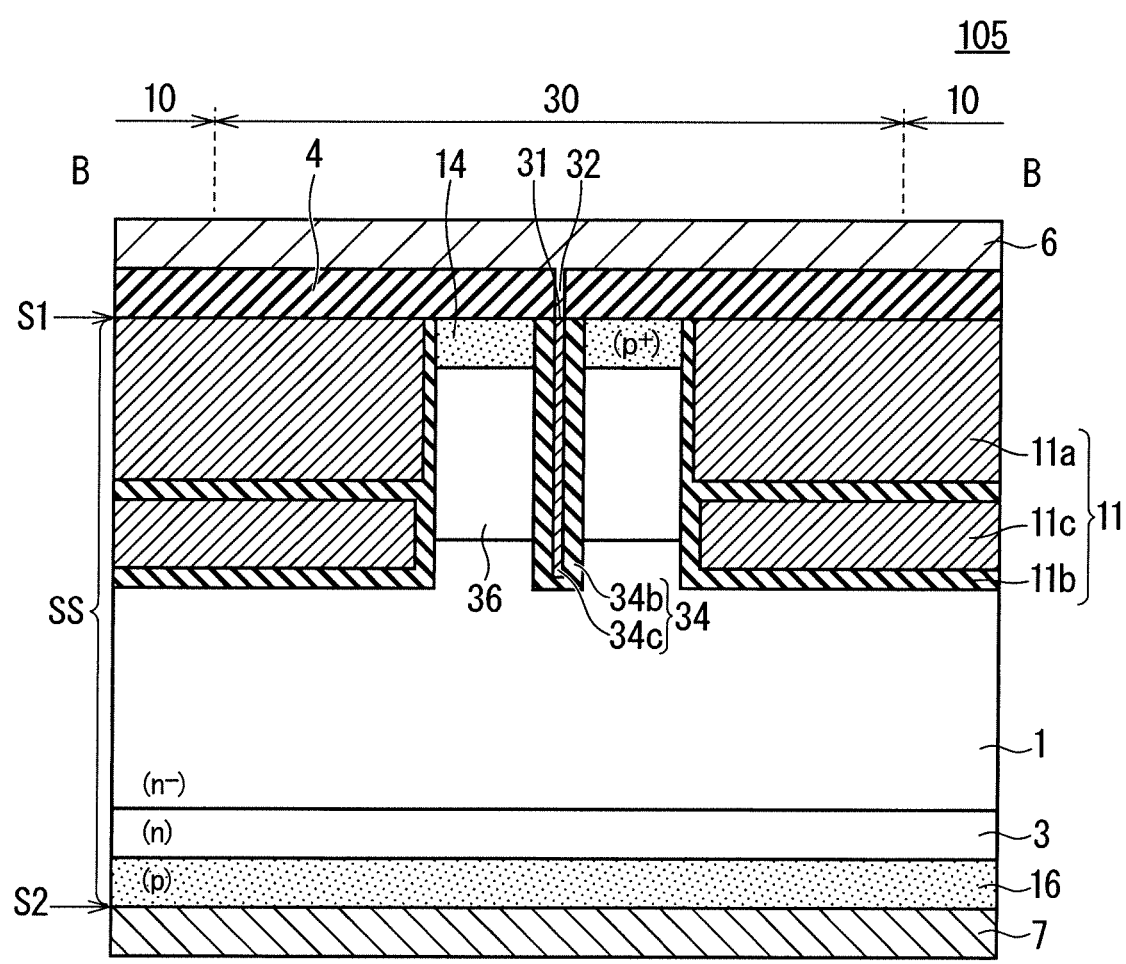
FIG. 19 is a partial cross-sectional view of the reverse conducting IGBT according to the embodiment 6 of the present disclosure.

FIG. 18 is a plan view of enlarging the region 80 enclosed by the broken line in FIG. 1, and FIG. 19 is a cross-sectional view along a B-B line viewed from an arrow direction in a plan view of the region 80 illustrated in FIG. 18. The cross-sectional view along the A-A line viewed from the arrow direction in FIG. 18 is the same as that in FIG. 4.

As illustrated in FIG. 18, a planar configuration of the region 80 in the RC-IGBT 105 is the same as the RC-IGBT 102 illustrated in FIG. 13. However, as illustrated in FIG. 19, a p-type well layer 36 (sixth semiconductor layer) is provided in place of the base layer 15 and the carrier accumulation layer 2 on the side of the second main surface S2 of the IGBT contact layer 14 in the embedded electrode extraction region 30 in the RC-IGBT 105. Broken lines on right and left sides of FIG. 18 indicate end portions of the well layer 36 in a horizontal direction, and the well layer 36 is provided to extend to substantially a whole region of the embedded electrode extraction region 30.

As illustrated in FIG. 18, the well layer 36 is provided not to have contact with the emitter layer 13 formed in the IGBT region 10.

The well layer 36 is provided to the embedded electrode extraction region 30, thus an electrical field concentration in the bottom part of the trench in the embedded electrode extraction part 31 is reduced, and gate reliability can be improved.

That is to say, when the carrier accumulation layer 2 is provided, an electrical field inclination increases in the carrier accumulation layer 2, thus electrical field in the bottom part of the trench increases and the electrical field concentration increases. When the carrier accumulation layer 2 is not provided but the well layer 36 is formed, the electrical field concentration can be reduced.

The bottom part of the well layer 36 is formed in a position shallower than the embedded electrode intersection trench gate 34 in FIG. 19, however, the well layer 36 may also be formed so that the bottom part thereof is shallower than the embedded electrode intersection trench gate 34.

Embodiment 7

An RC-IGBT 106 according to an embodiment 7 of the present disclosure is described next. An upper surface configuration of the whole RC-IGBT 106 is the same as that of the RC-IGBT 100 illustrated in FIG. 1, thus there is a case of describing the upper surface configuration thereof by citing FIG. 1.

Figure 20:
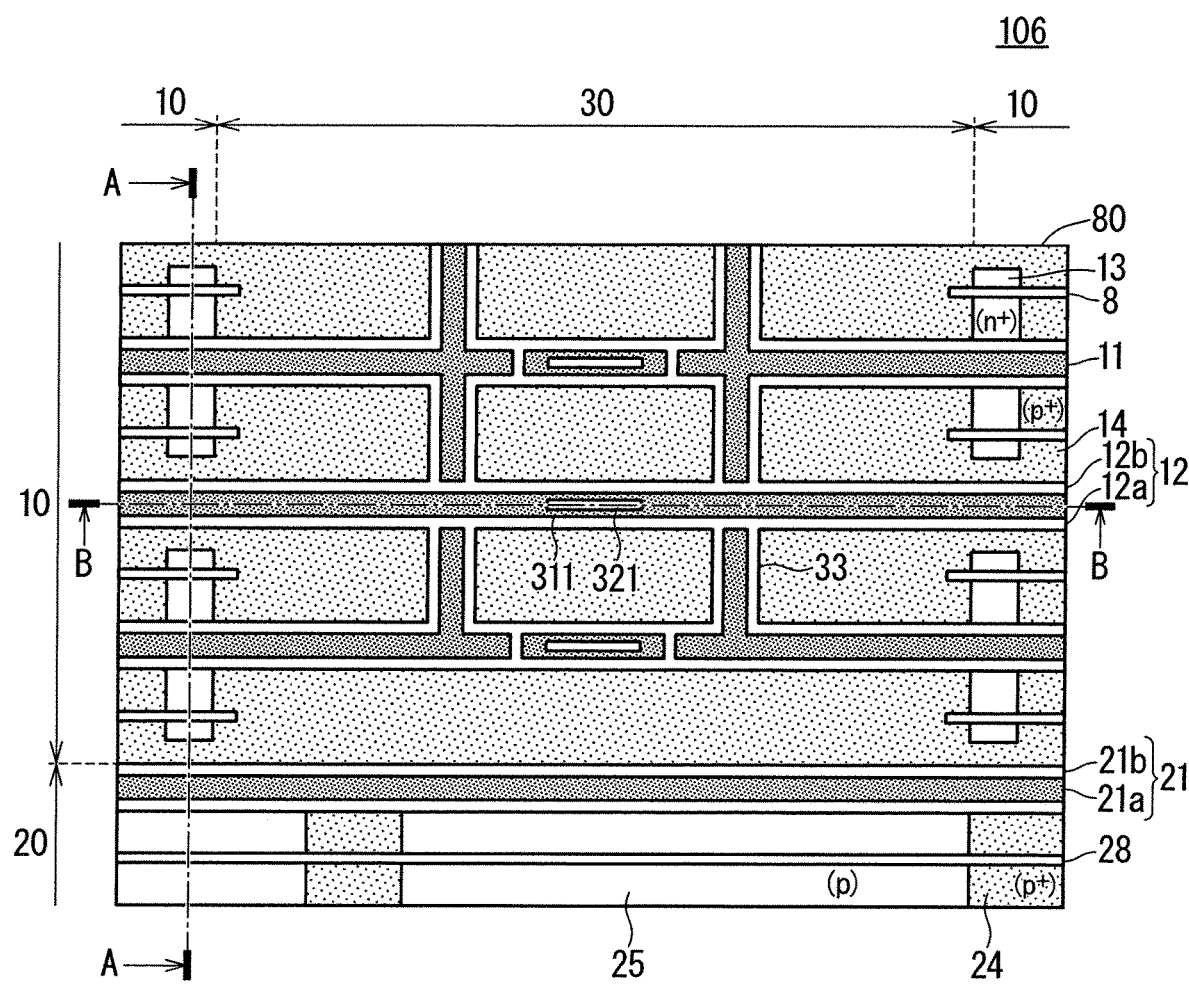
FIG. 20 is a partial plan view of a reverse conducting IGBT according to an embodiment 7 of the present disclosure.
Figure 21:
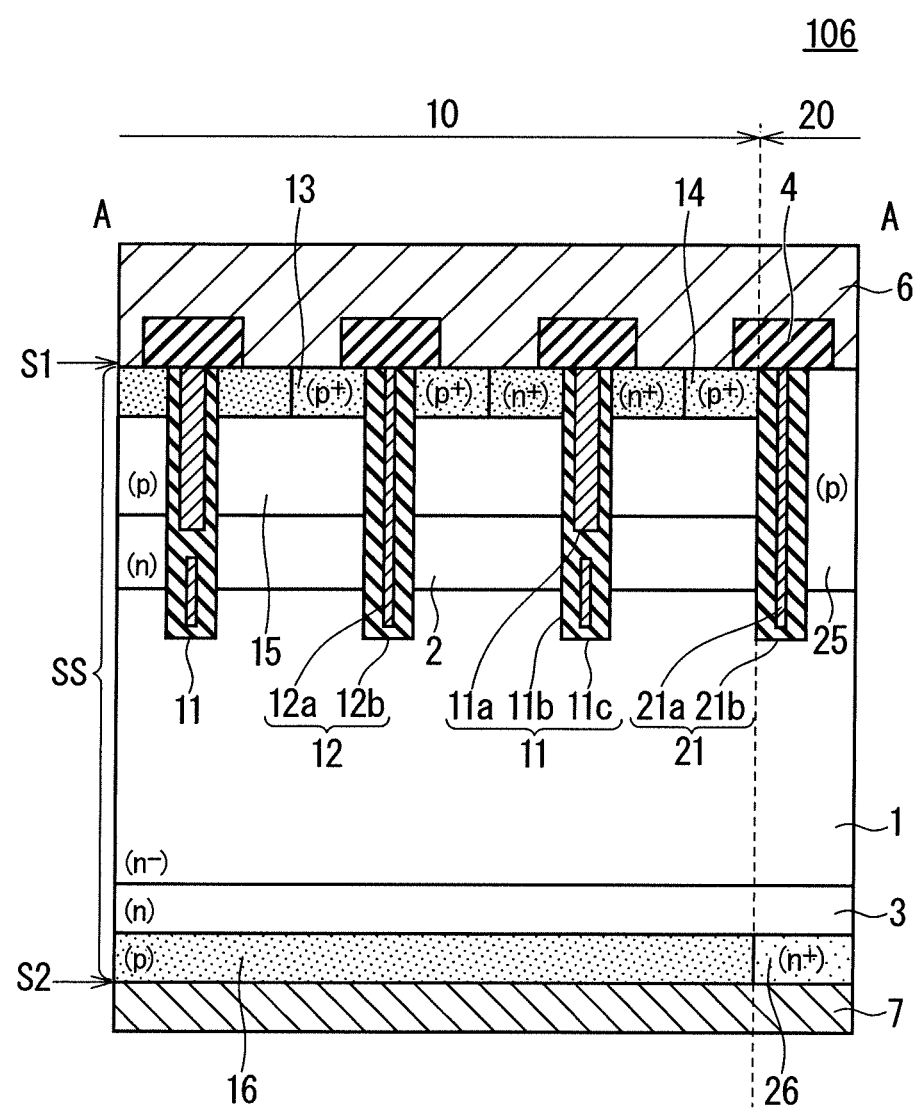
FIG. 21 is a partial cross-sectional view of the reverse conducting IGBT according to the embodiment 7 of the present disclosure.
Figure 22:
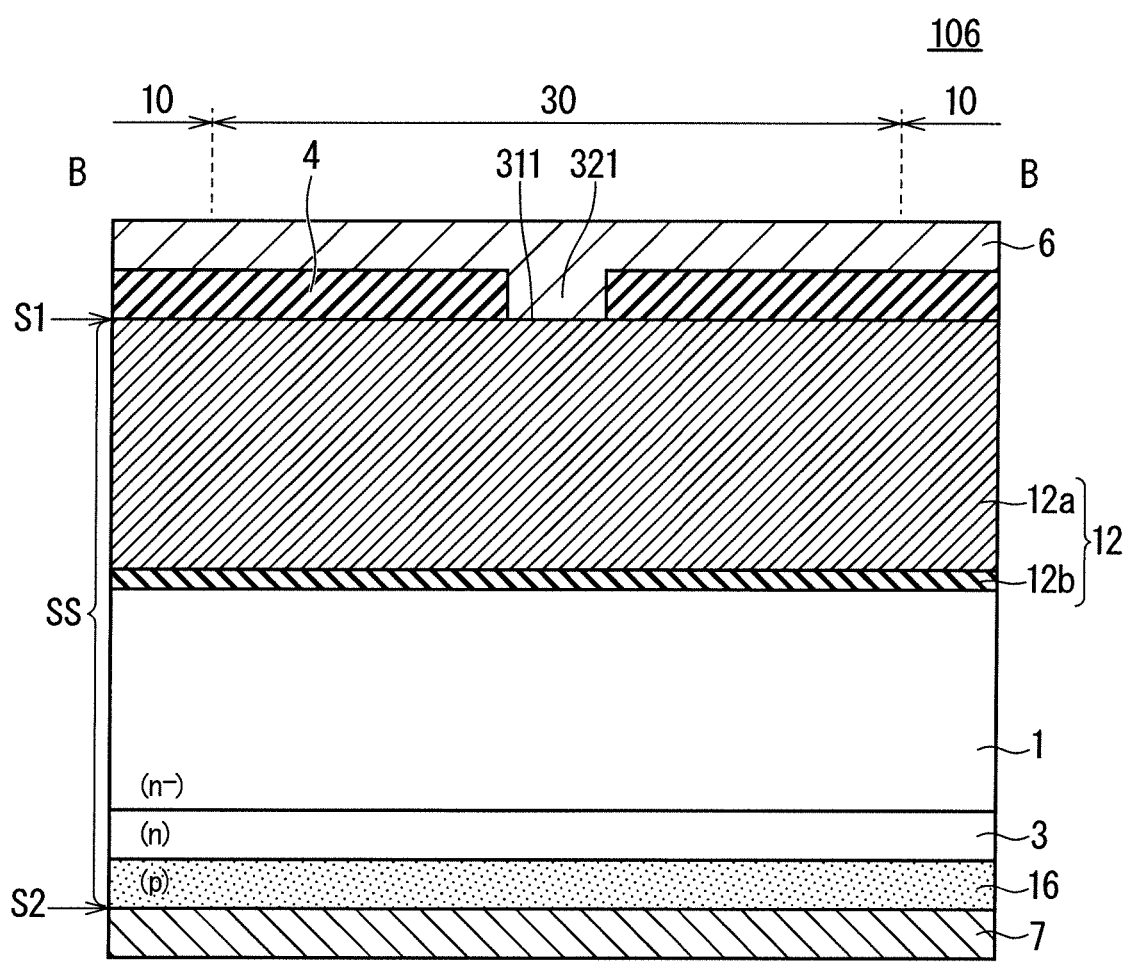
FIG. 22 is a partial cross-sectional view of the reverse conducting IGBT according to the embodiment 7 of the present disclosure.

FIG. 20 is a plan view of enlarging a region 80 enclosed by the broken line in the RC-IGBT 100 illustrated in FIG. 1, FIG. 21 is a cross-sectional view along an A-A line viewed from an arrow direction in a plan view of the region 80 illustrated in FIG. 20, and FIG. 22 is a cross-sectional view along a B-B line viewed from an arrow direction.

As illustrated in FIG. 20, a dummy trench gate 12 (second trench gate) is provided in place of some active trench gate 11 in the IGBT region 10 and the embedded electrode extraction region 30 in the RC-IGBT 106, and a dummy electrode contact 321 (second contact) is provided to the dummy trench gate 12 in the embedded electrode extraction region 30.

As illustrated in FIG. 21, the dummy trench gate 12 is made up of a dummy trench insulating film 12b (second gate insulating film) covering an inner surface of the trench and a dummy trench electrode 12a (third gate electrode) embedded in the trench via the dummy trench insulating film 12b.

As illustrated in FIG. 22, the dummy electrode contact 321 is provided by opening the interlayer insulating film 4 in the dummy trench gate 12, and the dummy trench electrode 12a is exposed to the bottom part thereof to constitute a dummy electrode extraction part 311 (second electrode extraction part). Both ends of the dummy trench electrode 12a in a longitudinal direction are not connected to the wiring region 50, but are connected to the emitter electrode 6 via the dummy electrode contact 321, and the dummy trench electrode 12a serves as an emitter potential.

The dummy trench gate 12 is provided, thus the number of active trench gates 11 decreases, and a unit cell functioning as the IGBT decreases, thus a parasitic capacity of the IGBT can be reduced.

As illustrated in FIG. 20, the gate intersection trench gate 33 is divided into upper and lower sides by the dummy trench gate 12 in the RC-IGBT 106, however, the gate intersection trench gate 33 connects the active trench gates 11 facing each other in a portion where the dummy trench gate 12 is not provided.

Embodiment 8

An RC-IGBT 107 according to an embodiment 8 of the present disclosure is described next. An upper surface configuration of the whole RC-IGBT 107 is the same as that of the RC-IGBT 100 illustrated in FIG. 1, thus there is a case of describing the upper surface configuration thereof by citing FIG. 1.

Figure 23:
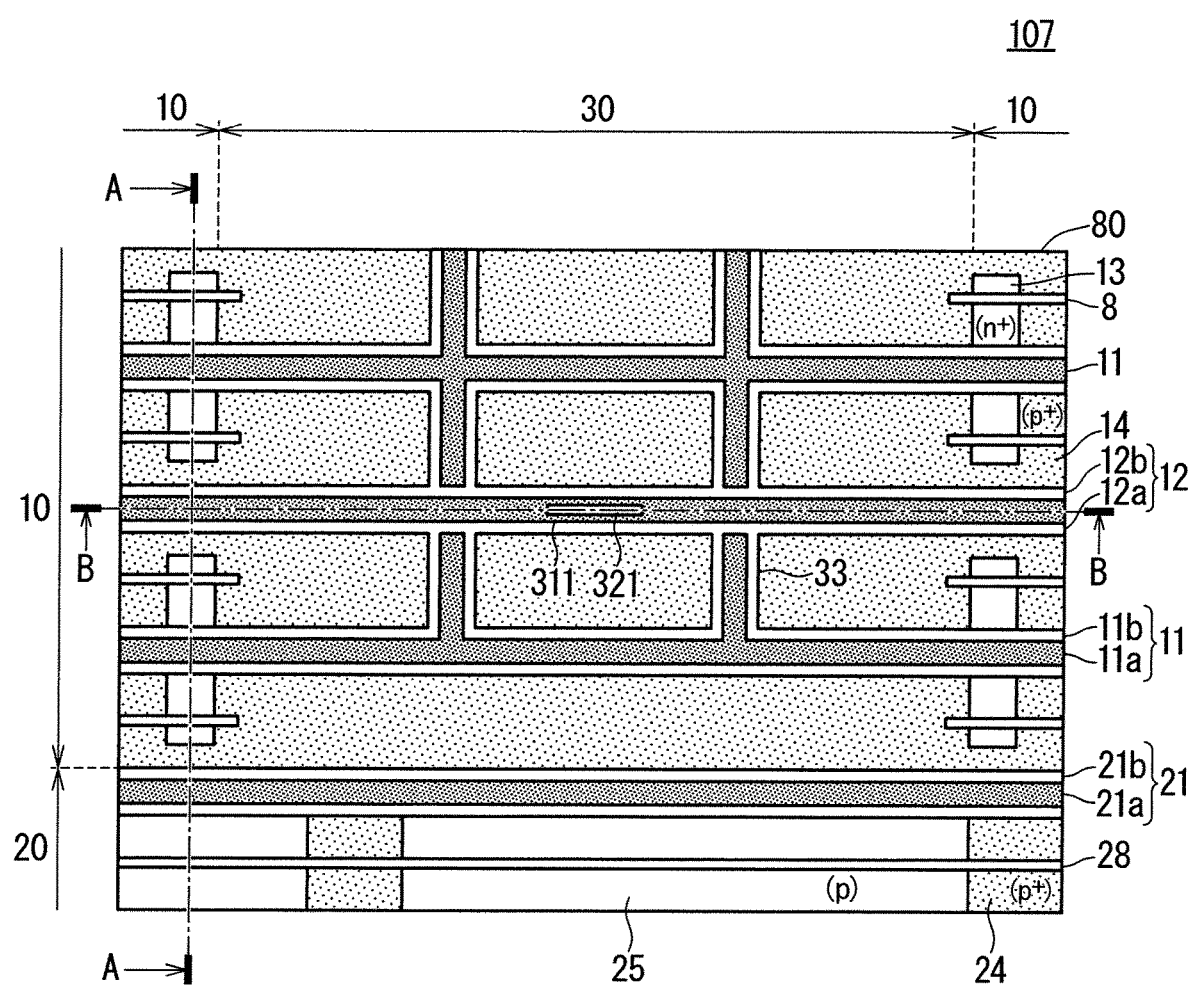
FIG. 23 is a partial plan view of a reverse conducting IGBT according to an embodiment 8 of the present disclosure.

FIG. 23 is a plan view of enlarging the region 80 enclosed by the broken line in FIG. 1. The cross-sectional view along an A-A line viewed from an arrow direction in FIG. 23 is the same as that in FIG. 21, and the cross-sectional view along a B-B line viewed from an arrow direction in FIG. 23 is the same as that in FIG. 22.

As illustrated in FIG. 23, the RC-IGBT 107 has a configuration that the embedded electrode extraction part 31 is not formed in the active trench gate 11 in the embedded electrode extraction region 30. By adopting such a configuration, a part where the gate current route is blocked is reduced between the wiring regions 50 (FIG. 1) disposed on the right and left sides of the active region AR (FIG. 1). That is to say, the active trench gate 11 where the embedded electrode extraction part 31 is not formed is connected to the wiring region 50 on right and left sides not shown in FIG. 23 via the embedded electrode extraction region 30 and the IGBT regions 10 on right and left sides thereof, and the active trench gate 11 does not include a disconnected part.

Thus, the trench gate electrode 11a in which the potential distribution is not balanced on the right and left sides can be eliminated, and the state where the operation is unbalanced in the semiconductor chip can be suppressed.

As illustrated in FIG. 23, the gate intersection trench gate 33 is divided into upper and lower sides by the dummy trench gate 12 in the RC-IGBT 107, however, the gate intersection trench gate 33 connects the active trench gates 11 facing each other in a portion where the dummy trench gate 12 is not provided.

Embodiment 9

An RC-IGBT 108 according to an embodiment 9 of the present disclosure is described next. An upper surface configuration of the whole RC-IGBT 108 is the same as that of the RC-IGBT 100 illustrated in FIG. 1, thus there is a case of describing the upper surface configuration thereof by citing FIG. 1.

Figure 24:
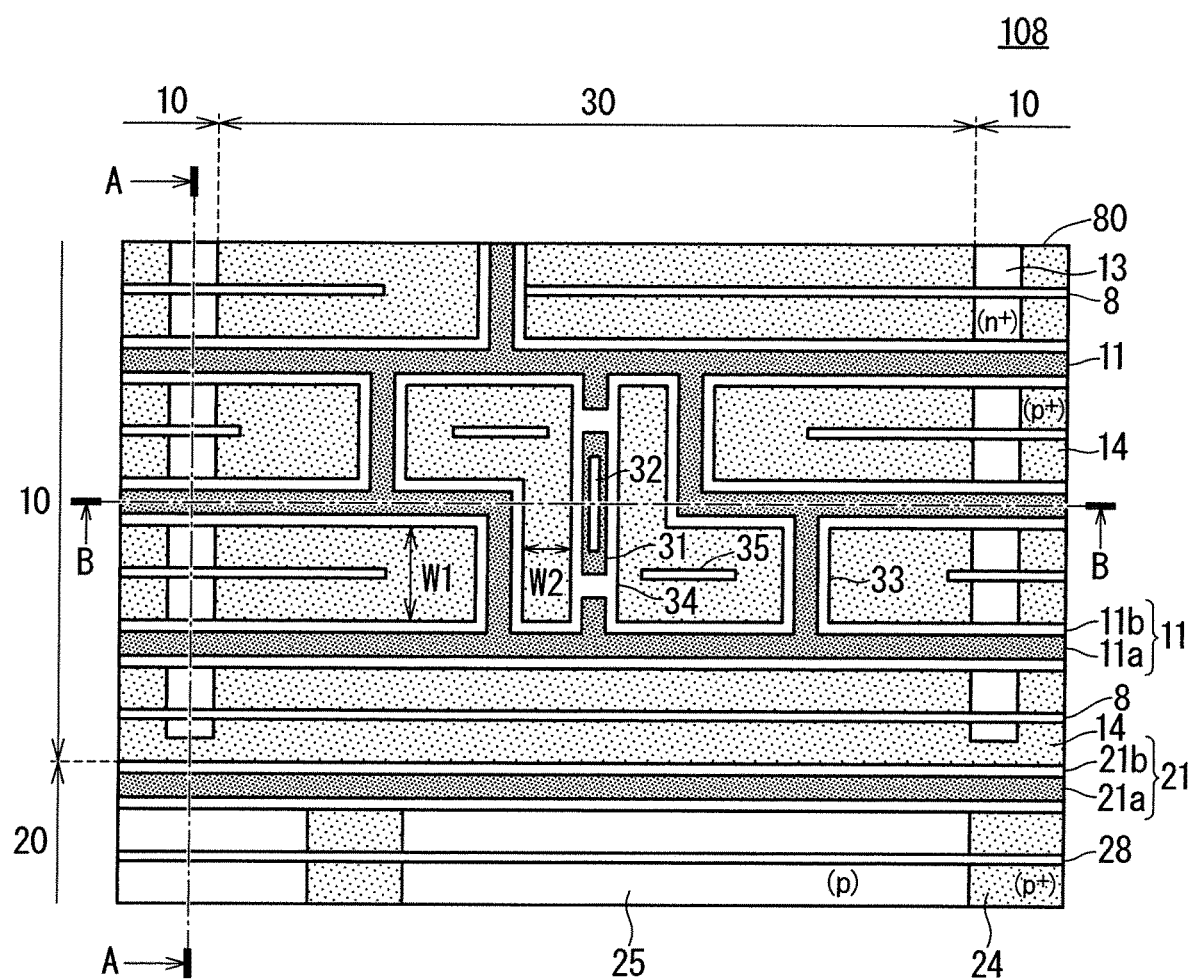
FIG. 24 is a partial plan view of a reverse conducting IGBT according to an embodiment 9 of the present disclosure.
Figure 25:
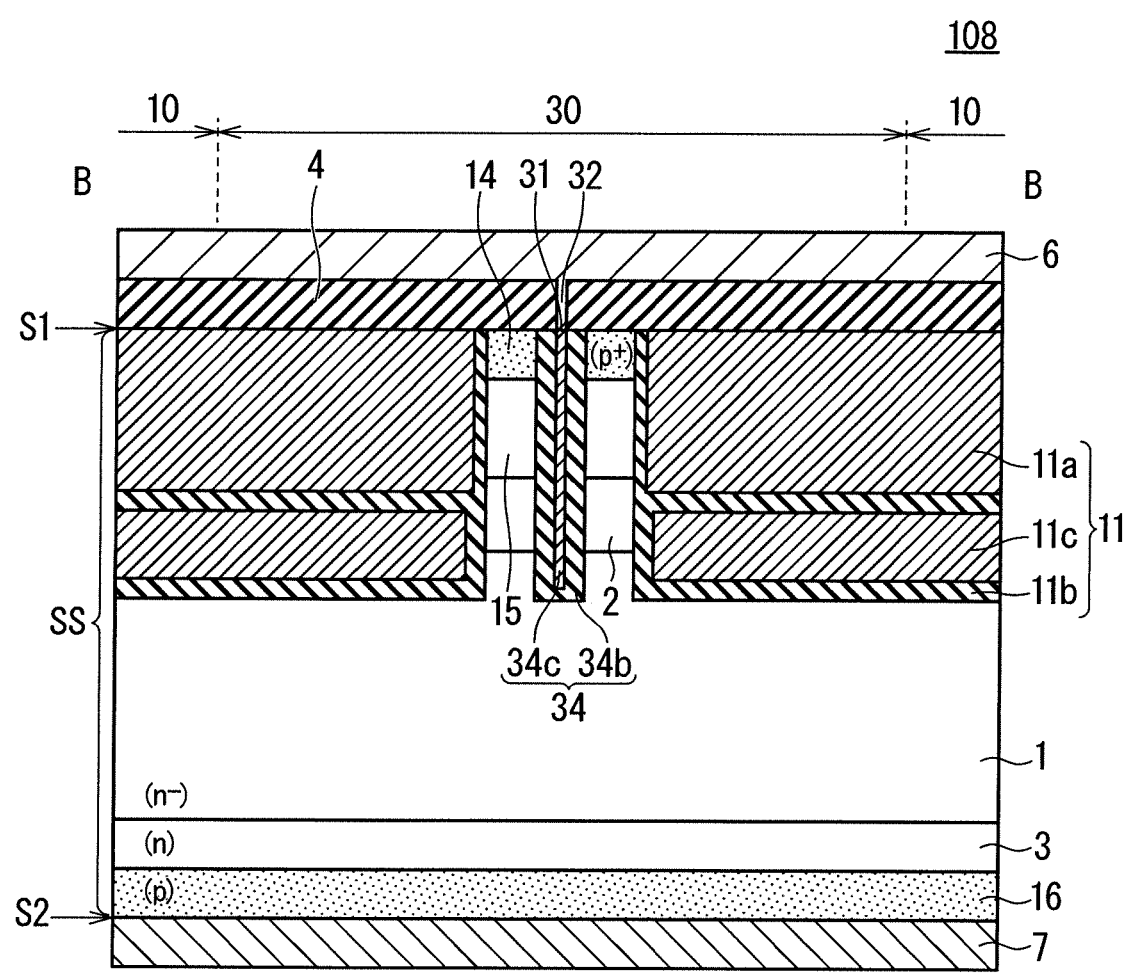
FIG. 25 is a partial cross-sectional view of the reverse conducting IGBT according to the embodiment 9 of the present disclosure.

FIG. 24 is a plan view of enlarging the region 80 enclosed by the broken line in FIG. 1. The cross-sectional view along an A-A line viewed from an arrow direction in a plan view of the region 80 illustrated in FIG. 24 is the same as that in FIG. 4, and FIG. 25 is a cross-sectional view along a B-B line viewed from an arrow direction in FIG. 24.

As illustrated in FIG. 24, the gate intersection trench gates 33 are disposed at intervals in the horizontal direction, that is to say, the extension direction of the active trench gate 11 for each pair of the active trench gates 11 facing each other in the embedded electrode extraction region 30 in the RC-IGBT 108 in the manner similar to the RC-IGBT 104 according to the embodiment 5 in FIG. 17.

In the manner similar to the RC-IGBT 104 in the embodiment 5, the embedded electrode intersection trench gate 34 is disposed between the gate intersection trench gates 33 on the right and left sides, and the embedded electrode intersection trench gate 34 intersects with the active trench gates 11 on the upper and lower sides. An interval W2 between the gate intersection trench gate 33 and the embedded electrode intersection trench gate 34 in a horizontal direction is smaller than an interval W1 between the active trench gates 11 facing each other in a vertical direction.

By adopting such a configuration, a mesa region in which the IGBT contact layer 14 with the interval W2 between the gate intersection trench gate 33 and the embedded electrode intersection trench gate 34 is provided can be sufficiently depleted, and the withstand voltage can be improved.

That is to say, in the IGBT including the carrier accumulation layer 2, when a trench gate interval is large, a depletion layer does not sufficiently spread between the trench gates and the withstand voltage decreases, however, in the RC-IGBT 108, the interval W2 of the mesa region is reduced, thus the region between the trench gates can be sufficiently depleted, and the withstand voltage can be improved.

Embodiment 10

An RC-IGBT 109 according to an embodiment 10 of the present disclosure is described next. An upper surface configuration of the whole RC-IGBT 109 is the same as that of the RC-IGBT 100 illustrated in FIG. 1, thus there is a case of describing the upper surface configuration thereof by citing FIG. 1.

Figure 26:
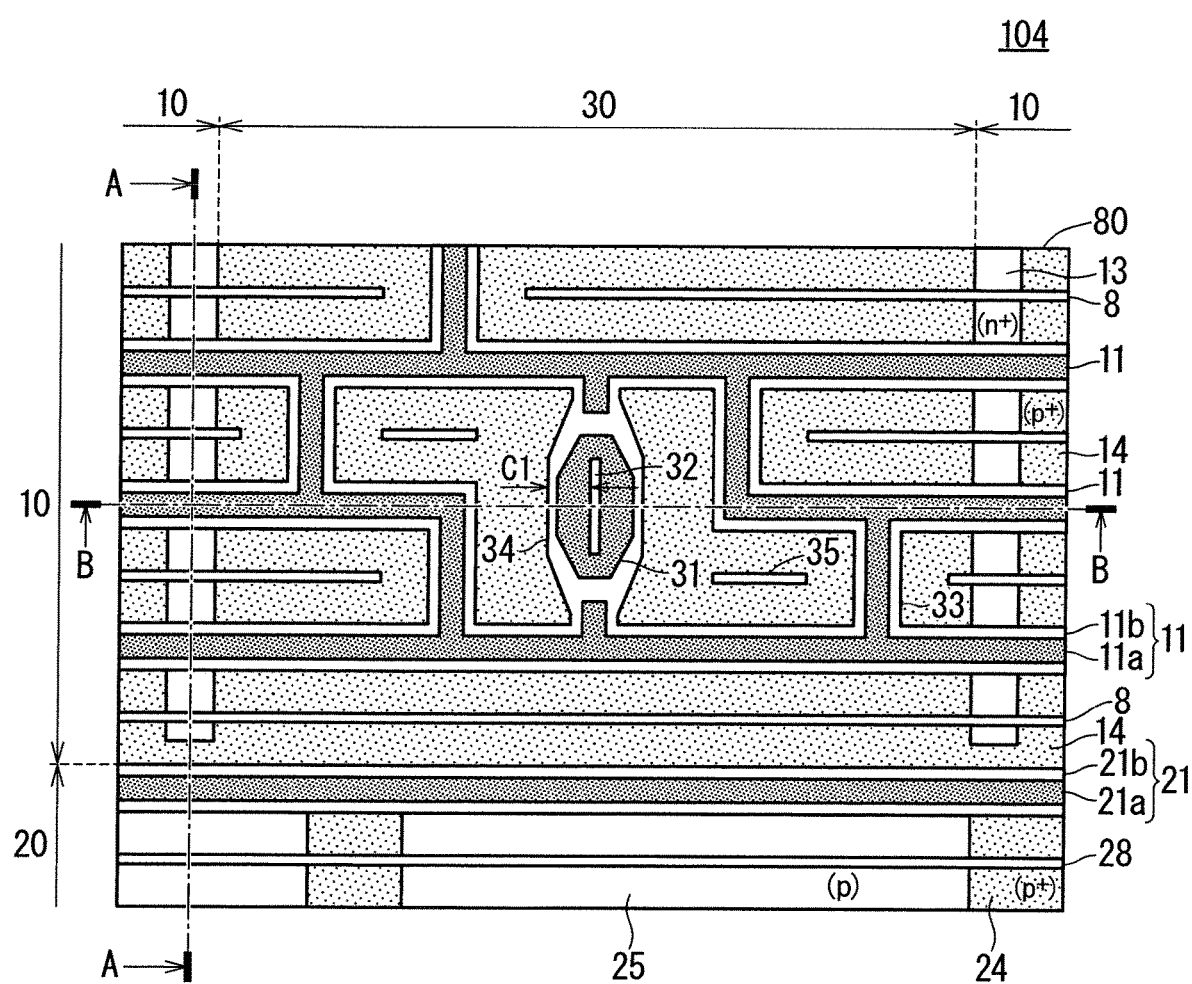
FIG. 26 is a partial plan view of a reverse conducting IGBT according to an embodiment 10 of the present disclosure.
Figure 27:
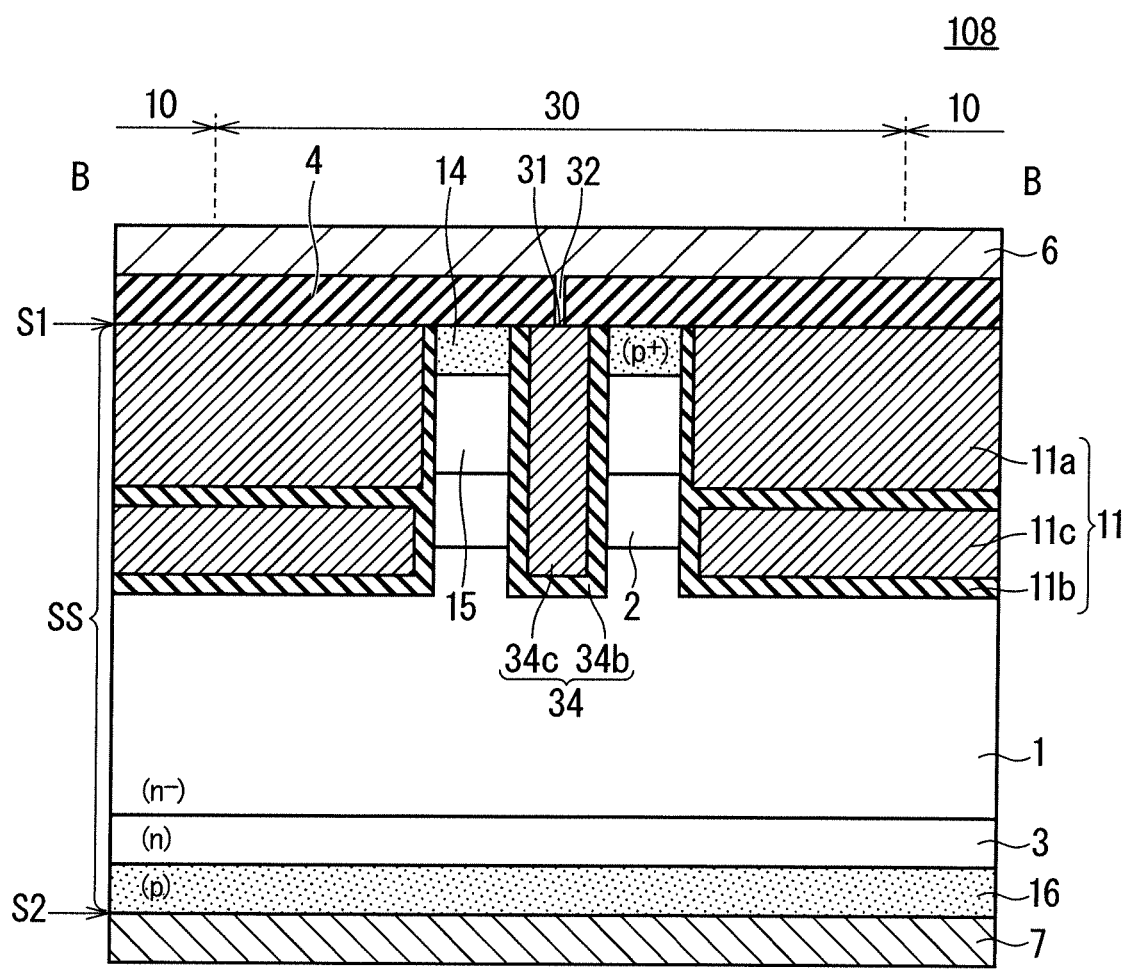
FIG. 27 is a partial cross-sectional view of the reverse conducting IGBT according to the embodiment 10 of the present disclosure.

FIG. 26 is a plan view of enlarging the region 80 enclosed by the broken line in FIG. 1. The cross-sectional view along the A-A line viewed from the arrow direction in FIG. 26 is the same as that in FIG. 4, and FIG. 27 is a cross-sectional view along the B-B line viewed from the arrow direction.

As illustrated in FIG. 26, the gate intersection trench gate 33 is provided to connect three active trench gates 11 in the embedded electrode extraction region 30 in the RC-IGBT 109. The gate intersection trench gates 33 are provided at intervals so as to intersect at two points of first and third active trench gates 11 from a side of the diode region 20. The second active trench gate 11 from the side of the diode region 20 is disconnected in the gate intersection trench gates 33 on the right and left sides, and intersect with the gate intersection trench gate 33 at the disconnected part.

The embedded electrode intersection trench gate 34 parallel to the gate intersection trench gate 33 is disposed between the gate intersection trench gates 33 on the right and left sides, and the embedded electrode intersection trench gate 34 intersects with the active trench gates 11 on upper and lower sides. The embedded electrode extraction part 31 and the embedded electrode contact 32 are provided to the embedded electrode intersection trench gate 34.

A width of the embedded electrode intersection trench gate 34 is formed larger in a center part than that of the active trench gate 11 in the RC-IGBT 109 as illustrated in FIG. 26, and a width of a part intersecting with the active trench gates 11 on the upper and lower sides is the same as that of the active trench gate 11, thus the embedded electrode intersection trench gate 34 has a tapered shape in a plan view.

By adopting such a configuration, a clearance Cl between the embedded electrode extraction part 31 and the embedded electrode contact 32 can be widened without changing a trench width of a part intersecting with the active trench gate 11, thus a detachment of a contact position from an upper portion of the embedded electrode extraction part 31 in forming the contact, that is a so-called stepping out of the contact can be prevented.

The embedded electrode intersection trench gate 34 formed to have the large width has a small aspect ratio, thus a trench depth can be made large compared with a case where the embedded electrode intersection trench gate 34 is formed to have the same width as the active trench gate 11.

The configuration of applying the present disclosure to the RC-IGBT is described in the above embodiments 1 to 10, however, the present disclosure can also be applied to a configuration of a single IGBT, and also in such a case, the effect similar to that in the embodiments 1 to 10 is achieved.

In the meanwhile, the IGBT and the reflux diode are provided in the same semiconductor substrate in the RC-IGBT, thus an integration degree can be increased compared with a case where the IGBT and the reflux diode are provided in separate semiconductor substrates, and the semiconductor device can be downsized.

Other Application Example

Applicable as the semiconductor substrate SS used in the present disclosure described above is a floating zone (FZ) wafer manufactured by an FZ method, a magnetic field applied Czochralski (MCZ) wafer manufactured by an MCZ method, or an epitaxial wafer manufactured by an epitaxial growing method, however, the semiconductor substrate SS is not limited thereto.

Each embodiment can be arbitrarily combined, or each embodiment can be appropriately varied or omitted within a scope of the present disclosure.

The present disclosure descried above is collectively described hereinafter as an appendix.

APPENDIX 1

A semiconductor device, comprising:
a semiconductor substrate including at least:
   a first semiconductor layer of a first conductivity type;
   a second semiconductor layer of a first conductivity type on the first semiconductor layer;
   a third semiconductor layer of a second conductivity type on the second semiconductor layer; and
   a fourth semiconductor layer of a first conductivity type provided on an upper layer part of the third semiconductor layer;
a plurality of first trench gates passing through the fourth semiconductor layer, the third semiconductor layer, and the second semiconductor layer in a thickness direction to reach an inner side of the first semiconductor layer;
an interlayer insulating film covering each of the plurality of first trench gates;
a first main electrode having contact with the fourth semiconductor layer; and
a second main electrode provided on a side opposite to the first main electrode in a thickness direction of the semiconductor substrate, wherein
each of the plurality of first trench gates has a two-stage structure of a first gate electrode provided on a lower side as a side of the second main electrode and a second gate electrode provided on an upper side as a side of the first main electrode,
an inner surface of each of the plurality of first trench gates and an upper surface of the first gate electrode are covered by a first gate insulating film,
the plurality of first trench gates are disposed at intervals so that a longitudinal direction of the plurality of first trench gates is parallel to an active region in which main current flows,
the second gate electrode includes a first electrode extraction part connected to a wiring region provided along an outer periphery of the active region on both ends of the plurality of first trench gates in the longitudinal direction, disconnected in an electrode extraction region provided in a center part of the active region, and connected to the first gate electrode in a disconnected part,
the first gate electrode is electrically connected to the first main electrode via a first contact passing through the interlayer insulating film in the first electrode extraction part,
the electrode extraction region includes a gate intersection trench gate provided to connect first trench gates facing each other in the plurality of first trench gates so as to be perpendicular to the first trench gates facing each other in a plan view, and
the gate intersection trench gate has a same cross-sectional structure as the plurality of first trench gates.

APPENDIX 2

The semiconductor device according to the appendix 1, wherein
the first electrode extraction part is provided in some first trench gate in the plurality of first trench gates.

APPENDIX 3

The semiconductor device according to the appendix 1, further comprising
a second trench gate passing through the fourth semiconductor layer, the third semiconductor layer, and the second semiconductor layer in a thickness direction to reach an inner side of the first semiconductor layer, wherein
the second trench gate includes a second gate insulating film covering an inner surface of a trench and a third gate electrode having contact with the second gate insulating film, and is covered by the interlayer insulating film, and
the second trench gate includes a second electrode extraction part disposed at intervals in parallel to any one of the plurality of first trench gates and electrically connected to the first main electrode via a second contact passing through the interlayer insulating film in the electrode extraction region provided in a center part of the active region.

APPENDIX 4

A semiconductor device, comprising:
a semiconductor substrate including at least:
a first semiconductor layer of a first conductivity type;
a second semiconductor layer of a first conductivity type on the first semiconductor layer;
a third semiconductor layer of a second conductivity type on the second semiconductor layer; and
a fourth semiconductor layer of a first conductivity type provided on an upper layer part of the third semiconductor layer;
a plurality of first trench gates and a second trench gate passing through the fourth semiconductor layer, the third semiconductor layer, and the second semiconductor layer in a thickness direction to reach an inner side of the first semiconductor layer;
an interlayer insulating film covering each of the plurality of first trench gates and the second trench gate;
a first main electrode having contact with the fourth semiconductor layer; and
a second main electrode provided on a side opposite to the first main electrode in a thickness direction of the semiconductor substrate, wherein
each of the plurality of first trench gates has a two-stage structure of a first gate electrode provided on a lower side as a side of the second main electrode and a second gate electrode provided on an upper side as a side of the first main electrode,
an inner surface of each of the plurality of first trench gates and an upper surface of the first gate electrode are covered by a first gate insulating film,
the first gate electrode is electrically connected to the first main electrode,
the plurality of first trench gates are disposed at intervals so that a longitudinal direction of the plurality of first trench gates is parallel to an active region in which main current flows,
the second gate electrode passes through an electrode extraction region provided in a center part of the active region to be connected to a wiring region provided along an outer periphery of the active region on both ends of the plurality of first trench gates in the longitudinal direction,
the electrode extraction region includes a gate intersection trench gate provided to be perpendicular to the plurality of first trench gates in a plan view,
the gate intersection trench gate has a same cross-sectional structure as the plurality of first trench gates, and
the second trench gate includes:
a second gate insulating film covering an inner surface of a trench;
a third gate electrode having contact with the second gate insulating film; and
an electrode extraction part disposed at intervals in parallel to any one of the plurality of first trench gates and electrically connected to the first main electrode via a contact passing through the interlayer insulating film in the electrode extraction region.

APPENDIX 5

A semiconductor device, comprising:
a semiconductor substrate including at least:

a first semiconductor layer of a first conductivity type;
a second semiconductor layer of a first conductivity type on the first semiconductor layer;
a third semiconductor layer of a second conductivity type on the second semiconductor layer; and
a fourth semiconductor layer of a first conductivity type provided on an upper layer part of the third semiconductor layer;
a plurality of first trench gates passing through the fourth semiconductor layer, the third semiconductor layer, and the second semiconductor layer in a thickness direction to reach an inner side of the first semiconductor layer;
an interlayer insulating film covering each of the plurality of first trench gates;
a first main electrode having contact with the fourth semiconductor layer; and
a second main electrode provided on a side opposite to the first main electrode in a thickness direction of the semiconductor substrate, wherein
each of the plurality of first trench gates has a two-stage structure of a first gate electrode provided on a lower side as a side of the second main electrode and a second gate electrode provided on an upper side as a side of the first main electrode,
an inner surface of each of the plurality of first trench gates and an upper surface of the first gate electrode are covered by a first gate insulating film,
the plurality of first trench gates are disposed at intervals so that a longitudinal direction of the plurality of first trench gates is parallel to an active region in which main current flows, and at least one of the plurality of first trench gates is disconnected in an electrode extraction region provided in a center part of the active region,
the electrode extraction region includes:
two gate intersection trench gates provided to connect two first trench gates facing each other with a disconnected first trench gate therebetween to be perpendicular to each of the two first trench gates in a plan view; and
an electrode intersection trench gate provided in parallel to the two gate intersection trench gates to connect the two first trench gates,
the two gate intersection trench gates and the electrode intersection trench gate are covered by the interlayer insulating film,
the second gate electrode is connected to a wiring region provided along an outer periphery of the active region on both ends of the plurality of first trench gates in the longitudinal direction,
the two gate intersection trench gates have a same cross-sectional structure as the plurality of first trench gates,
the electrode intersection trench gate includes:
a second gate insulating film passing through the fourth semiconductor layer, the third semiconductor layer, and the second semiconductor layer in a thickness direction to reach an inner side of the first semiconductor layer and a third gate electrode having contact with the second gate insulating film; and
a first electrode extraction part connecting the first main electrode and the third gate electrode via a first contact passing through the interlayer insulating film, and
the third gate electrode is connected to the first gate electrode of the two first trench gates.

APPENDIX 6

The semiconductor device according to the appendix 5, wherein
the electrode extraction region further includes:
a fifth semiconductor layer (14) of a second conductivity type provided in a same layer as the fourth semiconductor layer; and
a second contact passing through the interlayer insulating film to connect the first main electrode and the fifth semiconductor layer between the two gate intersection trench gates and the electrode intersection trench gate.

APPENDIX 7

The semiconductor device according to the appendix 5, wherein
the two gate intersection trench gates are disposed between the two first trench gates facing each other at intervals in the longitudinal direction.

APPENDIX 8

The semiconductor device according to the appendix 5, wherein
the electrode extraction region includes:
a fifth semiconductor layer of a second conductivity type provided, in place of the second, third, and fourth semiconductor layers, in a same layer as the fourth semiconductor layer; and
a sixth semiconductor layer of a second conductivity type provided below the fifth semiconductor layer.

APPENDIX 9

The semiconductor device according to the appendix 5, wherein
an interval in the longitudinal direction between the gate intersection trench gate and the electrode intersection trench gate is smaller than an arrangement interval of the plurality of first trench gates.

APPENDIX 10

The semiconductor device according to the appendix 5, wherein
a length of at least the first electrode extraction part in the longitudinal direction in the electrode intersection trench gate is larger than a length of the plurality of first trench gates in the longitudinal direction.

APPENDIX 11

The semiconductor device according to any one of the appendixes 1, 4, and 5, wherein
the semiconductor substrate includes a fifth semiconductor layer of a second conductivity type having contact with the second main electrode and a sixth semiconductor layer of a first conductivity type,
a region where the fifth semiconductor layer is formed constitutes a transistor region,
a region where the sixth semiconductor layer is formed constitutes a diode region,
the plurality of first trench gates are provided in the transistor region,
the diode region does not include the second, third, and fourth semiconductor layers, but includes a seventh semiconductor layer of a second conductivity type provided on the first semiconductor layer,
the first main electrode has contact with the seventh semiconductor layer, and includes a diode trench gate passing through the seventh semiconductor layer in a thickness direction to reach the first semiconductor layer, and the diode trench gate includes a diode trench insulating film covering an inner surface of a trench and a diode trench electrode having contact with the diode trench insulating film, and is covered by the interlayer insulating film.

APPENDIX 12

The semiconductor device according to the appendix 1, wherein each of the plurality of first trench gates has a tapered shape in which a width of a bottom part of the first semiconductor layer is smaller than a width of an opening part of the fourth semiconductor layer in a cross-sectional shape in an arrangement direction of the plurality of first trench gates, and the first electrode extraction part has a tapered shape in which a width of a bottom part on a side of the first gate electrode is larger than a width of the first contact in a cross-sectional shape in the longitudinal direction of the plurality of first trench gates.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
a semiconductor substrate including at least:
a first semiconductor layer of a first conductivity type;
a second semiconductor layer of a first conductivity type on the first semiconductor layer;
a third semiconductor layer of a second conductivity type on the second semiconductor layer; and
a fourth semiconductor layer of a first conductivity type provided on an upper layer part of the third semiconductor layer;
a plurality of first trench gates passing through the fourth semiconductor layer, the third semiconductor layer, and the second semiconductor layer in a thickness direction to reach an inner side of the first semiconductor layer;
an interlayer insulating film covering each of the plurality of first trench gates;
a first main electrode having contact with the fourth semiconductor layer; and
a second main electrode provided on a side opposite to the first main electrode in a thickness direction of the semiconductor substrate, wherein each of the plurality of first trench gates has a two-stage structure of a first gate electrode provided on a lower side as a side of the second main electrode and a second gate electrode provided on an upper side as a side of the first main electrode, an inner surface of each of the plurality of first trench gates and an upper surface of the first gate electrode are covered by a first gate insulating film, the plurality of first trench gates are disposed at intervals so that a longitudinal direction of the plurality of first trench gates is parallel to an active region in which main current flows, the second gate electrode includes a first electrode extraction part connected to a wiring region provided along an outer periphery of the active region on both ends of the plurality of first trench gates in the longitudinal direction, disconnected in an electrode extraction region provided in a center part of the active region, and connected to the first gate electrode in a disconnected part, the first gate electrode is electrically connected to the first main electrode via a first contact passing through the interlayer insulating film in the first electrode extraction part, the electrode extraction region includes a gate intersection trench gate provided to connect first trench gates facing each other in the plurality of first trench gates so as to be perpendicular to the first trench gates facing each other in a plan view, and the gate intersection trench gate has a same cross-sectional structure as the plurality of first trench gates.

2. The semiconductor device according to claim 1, wherein the first electrode extraction part is provided in some first trench gate in the plurality of first trench gates.

3. The semiconductor device according to claim 1, further comprising a second trench gate passing through the fourth semiconductor layer, the third semiconductor layer, and the second semiconductor layer in a thickness direction to reach an inner side of the first semiconductor layer, wherein the second trench gate includes a second gate insulating film covering an inner surface of a trench and a third gate electrode having contact with the second gate insulating film, and is covered by the interlayer insulating film, and the second trench gate includes a second electrode extraction part disposed at intervals in parallel to any one of the plurality of first trench gates and electrically connected to the first main electrode via a second contact passing through the interlayer insulating film in the electrode extraction region provided in a center part of the active region.

4. A semiconductor device, comprising:
a semiconductor substrate including at least:
a first semiconductor layer of a first conductivity type;
a second semiconductor layer of a first conductivity type on the first semiconductor layer;
a third semiconductor layer of a second conductivity type on the second semiconductor layer; and
a fourth semiconductor layer of a first conductivity type provided on an upper layer part of the third semiconductor layer;
a plurality of first trench gates and a second trench gate passing through the fourth semiconductor layer, the third semiconductor layer, and the second semiconductor layer in a thickness direction to reach an inner side of the first semiconductor layer;
an interlayer insulating film covering each of the plurality of first trench gates and the second trench gate;
a first main electrode having contact with the fourth semiconductor layer; and
a second main electrode provided on a side opposite to the first main electrode in a thickness direction of the semiconductor substrate, wherein each of the plurality of first trench gates has a two-stage structure of a first gate electrode provided on a lower side as a side of the second main electrode and a second gate electrode provided on an upper side as a side of the first main electrode, an inner surface of each of the plurality of first trench gates and an upper surface of the first gate electrode are covered by a first gate insulating film, the first gate electrode is electrically connected to the first main electrode, the plurality of first trench gates are disposed at intervals so that a longitudinal direction of the plurality of first trench gates is parallel to an active region in which main current flows, the second gate electrode passes through an electrode extraction region provided in a center part of the active region to be connected to a wiring region provided along an outer periphery of the active region on both ends of the plurality of first trench gates in the longitudinal direction, the electrode extraction region includes a gate intersection trench gate provided to be perpendicular to the plurality of first trench gates in a plan view, the gate intersection trench gate has a same cross-sectional structure as the plurality of first trench gates, and the second trench gate includes:
a second gate insulating film covering an inner surface of a trench;
a third gate electrode having contact with the second gate insulating film; and
an electrode extraction part disposed at intervals in parallel to any one of the plurality of first trench gates and electrically connected to the first main electrode via a contact passing through the interlayer insulating film in the electrode extraction region.

5. A semiconductor device, comprising:
a semiconductor substrate including at least:
a first semiconductor layer of a first conductivity type;
a second semiconductor layer of a first conductivity type on the first semiconductor layer;
a third semiconductor layer of a second conductivity type on the second semiconductor layer; and
a fourth semiconductor layer of a first conductivity type provided on an upper layer part of the third semiconductor layer;
a plurality of first trench gates passing through the fourth semiconductor layer, the third semiconductor layer, and the second semiconductor layer in a thickness direction to reach an inner side of the first semiconductor layer;
an interlayer insulating film covering each of the plurality of first trench gates;
a first main electrode having contact with the fourth semiconductor layer; and
a second main electrode provided on a side opposite to the first main electrode in a thickness direction of the semiconductor substrate, wherein
each of the plurality of first trench gates has a two-stage structure of a first gate electrode provided on a lower side as a side of the second main electrode and a second gate electrode provided on an upper side as a side of the first main electrode,
an inner surface of each of the plurality of first trench gates and an upper surface of the first gate electrode are covered by a first gate insulating film,
the plurality of first trench gates are disposed at intervals so that a longitudinal direction of the plurality of first trench gates is parallel to an active region in which main current flows, and at least one of the plurality of first trench gates is disconnected in an electrode extraction region provided in a center part of the active region,
the electrode extraction region includes:
two gate intersection trench gates provided to connect two first trench gates facing each other with a disconnected first trench gate therebetween to be perpendicular to each of the two first trench gates in a plan view; and
an electrode intersection trench gate provided in parallel to the two gate intersection trench gates to connect the two first trench gates,
the two gate intersection trench gates and the electrode intersection trench gate are covered by the interlayer insulating film,
the second gate electrode is connected to a wiring region provided along an outer periphery of the active region on both ends of the plurality of first trench gates in the longitudinal direction,
the two gate intersection trench gates have a same cross-sectional structure as the plurality of first trench gates,
the electrode intersection trench gate includes:
a second gate insulating film passing through the fourth semiconductor layer, the third semiconductor layer, and the second semiconductor layer in a thickness direction to reach an inner side of the first semiconductor layer and a third gate electrode having contact with the second gate insulating film; and
a first electrode extraction part connecting the first main electrode and the third gate electrode via a first contact passing through the interlayer insulating film, and
the third gate electrode is connected to the first gate electrode of the two first trench gates.

6. The semiconductor device according to claim 5, wherein
the electrode extraction region further includes:
a fifth semiconductor layer of a second conductivity type provided in a same layer as the fourth semiconductor layer; and
a second contact passing through the interlayer insulating film to connect the first main electrode and the fifth semiconductor layer between the two gate intersection trench gates and the electrode intersection trench gate.

7. The semiconductor device according to claim 5, wherein
the two gate intersection trench gates are disposed between the two first trench gates facing each other at intervals in the longitudinal direction.

8. The semiconductor device according to claim 5, wherein
the electrode extraction region further includes:
a fifth semiconductor layer of a second conductivity type provided, in place of the second, third, and fourth semiconductor layers, in a same layer as the fourth semiconductor layer; and
a sixth semiconductor layer of a second conductivity type provided below the fifth semiconductor layer.

9. The semiconductor device according to claim 5, wherein
an interval in the longitudinal direction between the gate intersection trench gate and the electrode intersection trench gate is smaller than an arrangement interval of the plurality of first trench gates.

10. The semiconductor device according to claim 5, wherein
a length of at least the first electrode extraction part in the longitudinal direction in the electrode intersection trench gate is larger than a length of the plurality of first trench gates in the longitudinal direction.

11. The semiconductor device according to claim 1, wherein
- the semiconductor substrate includes a fifth semiconductor layer of a second conductivity type having contact with the second main electrode and a sixth semiconductor layer of a first conductivity type,
- a region where the fifth semiconductor layer is formed constitutes a transistor region,
- a region where the sixth semiconductor layer is formed constitutes a diode region,
- the plurality of first trench gates are provided in the transistor region,
- the diode region does not include the second, third, and fourth semiconductor layers, but includes a seventh semiconductor layer of a second conductivity type provided on the first semiconductor layer;
- the first main electrode has contact with the seventh semiconductor layer, and includes a diode trench gate passing through the seventh semiconductor layer in a thickness direction to reach the first semiconductor layer, and
- the diode trench gate includes a diode trench insulating film covering an inner surface of a trench and a diode trench electrode having contact with the diode trench insulating film, and is covered by the interlayer insulating film.

12. The semiconductor device according to claim 4, wherein
- the semiconductor substrate includes a fifth semiconductor layer of a second conductivity type having contact with the second main electrode and a sixth semiconductor layer of a first conductivity type,
- a region where the fifth semiconductor layer is formed constitutes a transistor region,
- a region where the sixth semiconductor layer is formed constitutes a diode region,
- the plurality of first trench gates are provided in the transistor region,
- the diode region does not include the second, third, and fourth semiconductor layers, but includes a seventh semiconductor layer of a second conductivity type provided on the first semiconductor layer,
- the first main electrode has contact with the seventh semiconductor layer, and includes a diode trench gate passing through the seventh semiconductor layer in a thickness direction to reach the first semiconductor layer, and
- the diode trench gate includes a diode trench insulating film covering an inner surface of a trench and a diode trench electrode having contact with the diode trench insulating film, and is covered by the interlayer insulating film.

13. The semiconductor device according to claim 5, wherein
- the semiconductor substrate includes a fifth semiconductor layer of a second conductivity type having contact with the second main electrode and a sixth semiconductor layer of a first conductivity type,
- a region where the fifth semiconductor layer is formed constitutes a transistor region,
- a region where the sixth semiconductor layer is formed constitutes a diode region,
- the plurality of first trench gates are provided in the transistor region,
- the diode region does not include the second, third, and fourth semiconductor layers, but includes a seventh semiconductor layer of a second conductivity type provided on the first semiconductor layer;
- the first main electrode has contact with the seventh semiconductor layer, and includes a diode trench gate passing through the seventh semiconductor layer in a thickness direction to reach the first semiconductor layer, and
- the diode trench gate includes a diode trench insulating film covering an inner surface of a trench and a diode trench electrode having contact with the diode trench insulating film, and is covered by the interlayer insulating film.

14. The semiconductor device according to claim 1, wherein
- each of the plurality of first trench gates has a tapered shape in which a width of a bottom part of the first semiconductor layer is smaller than a width of an opening part of the fourth semiconductor layer in a cross-sectional shape in an arrangement direction of the plurality of first trench gates, and
- the first electrode extraction part has a tapered shape in which a width of a bottom part on a side of the first gate electrode is larger than a width of the first contact in a cross-sectional shape in the longitudinal direction of the plurality of first trench gates.

* * * * *